(12) United States Patent
Shiojiri et al.

(10) Patent No.: US 9,910,552 B2
(45) Date of Patent: Mar. 6, 2018

(54) WIRING BODY, WIRING BOARD, TOUCH SENSOR, AND METHOD FOR PRODUCING WIRING BODY

(71) Applicant: FUJIKURA LTD., Tokyo (JP)

(72) Inventors: Takeshi Shiojiri, Chiba (JP); Takaharu Hondo, Chiba (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/508,882

(22) PCT Filed: Feb. 1, 2016

(86) PCT No.: PCT/JP2016/052923
§ 371 (c)(1),
(2) Date: Mar. 3, 2017

(87) PCT Pub. No.: WO2016/125744
PCT Pub. Date: Aug. 11, 2016

(65) Prior Publication Data
US 2017/0199600 A1    Jul. 13, 2017

(30) Foreign Application Priority Data

Feb. 6, 2015 (JP) ................................ 2015-021975
Oct. 23, 2015 (JP) ................................ 2015-208875

(51) Int. Cl.
*G06F 3/044* (2006.01)
*H05K 1/03* (2006.01)
(Continued)

(52) U.S. Cl.
CPC .......... *G06F 3/044* (2013.01); *H05K 1/0313* (2013.01); *H05K 3/10* (2013.01); *H05K 3/28* (2013.01);
(Continued)

(58) Field of Classification Search
CPC ....................................................... G06F 3/044
(Continued)

(56) References Cited

U.S. PATENT DOCUMENTS

2008/0135283 A1    6/2008 Hibino et al.
2010/0230154 A1    9/2010 Naito et al.
(Continued)

FOREIGN PATENT DOCUMENTS

JP      2012-168301 A    9/2012
JP      2013-020530 A    1/2013
(Continued)

OTHER PUBLICATIONS

Office Action issued in corresponding Japanese Application No. 2015-208875 dated Dec. 22, 2015 (6 pages).
(Continued)

*Primary Examiner* — Hoa C Nguyen
*Assistant Examiner* — Stanley Tso
(74) *Attorney, Agent, or Firm* — Osha Liang LLP

(57) ABSTRACT

A wiring body includes a first conductor layer including a first conductor wire, a resin layer covering the first conductor layer, and a second conductor layer disposed on the first conductor layer through the resin layer and including a second conductor wire. The wiring body satisfies the formula $|H1-H2|<T1/3$ where H1 is a maximum height of the second conductor wire in a first region corresponding to the first conductor wire in a first predetermined sectional surface crossing the wiring body along the second conductor wire, H2 is a minimum height of the second conductor wire in a second region that is adjacent to the first region and has the same width as that of the first region in the first predetermined sectional surface, and T1 is a thickness of the first conductor wire in the first predetermined sectional surface.

11 Claims, 10 Drawing Sheets

(51) Int. Cl.
*H05K 3/10* (2006.01)
*H05K 3/28* (2006.01)

(52) U.S. Cl.
CPC .............. *G06F 2203/04103* (2013.01); *G06F 2203/04112* (2013.01); *H05K 2201/09045* (2013.01); *H05K 2201/09827* (2013.01); *H05K 2201/10151* (2013.01)

(58) Field of Classification Search
USPC ........................................................ 174/261
See application file for complete search history.

(56) References Cited

U.S. PATENT DOCUMENTS

| | | |
|---|---|---|
| 2013/0277194 A1 | 10/2013 | Kim et al. |
| 2014/0290980 A1 | 10/2014 | Tang et al. |
| 2014/0333855 A1 | 11/2014 | Park et al. |

FOREIGN PATENT DOCUMENTS

| | | |
|---|---|---|
| JP | 2013-228985 A | 11/2013 |
| JP | 2014-191717 A | 10/2014 |
| JP | 2014/219987 A | 11/2014 |
| TW | 201437866 A | 10/2014 |
| WO | 2014/161247 A1 | 10/2014 |

OTHER PUBLICATIONS

International Search Report issued in PCT/JP2016/052923 dated Apr. 12, 2016 (5 pages).
Written Opinion of the International Searching Authority issued in PCT/JP2016/052923 dated Apr. 12, 2016 (6 pages).
Extended European Search Report issued in corresponding European Application No. 16746575.6 dated Dec. 12, 2017 (10 pages).
Walker, Geoff, "Part 1: Fundamentals of Projected-Capacitive Touch Technology," XP055397433, http://www.walkermobile.com/Touch_Technologies_Tutorial_Latest_Version.pdf dated Jun. 1, 2014 (84 pages).

WIRING BODY, WIRING BOARD, TOUCH SENSOR, AND METHOD FOR PRODUCING WIRING BODY

TECHNICAL FIELD

The present invention relates to a wiring body, a wiring board, a touch sensor, and a method for producing the wiring body.

In the designated nations where incorporation of documents by reference is accepted, the contents of disclosed in Japanese Patent Application No. 2015-021975, filed on Feb. 6, 2015, and Japanese Patent Application No. 2015-208875, filed on Oct. 23, 2015 in Japan are incorporated by reference into the specification, and are regarded as a part of disclosure of this specification.

BACKGROUND ART

A fine metal wire which is configured by forming a metal fine particle layer in a recessed portion of a mold, and then, by placing, pressing, and closely attaching an uneven pattern surface of the mold onto a front surface of a photocurable resin layer on a substrate, and by allowing the metal particle layer to adhere to the photocurable resin layer by hardening a photocurable resin, is known (for example, refer to Patent Document 1).

CITATION LIST

Patent Document

Patent Document 1: JP 2012-168301 A

SUMMARY OF THE INVENTION

Problem to be Solved by the Invention

In an electrostatic capacitance type touch panel or the like where multi-touch can be performed, it is necessary to form a two-layered electrode. In this viewpoint, in a case where the fine metal wire of the technology described above is used as an electrode, and a photocurable resin is further laminated on the fine metal wire, and thus, a two-layered fine metal wire is prepared, a front surface of the photocurable resin easily becomes uneven due to the fine metal wire on a first layer, and thus, it is difficult to form the fine metal wire on a second layer. Then, in a case where formation failure occurs in the fine metal wire on the second layer, there is a problem in that a load based on an external force or the like is easily generated in the fine metal wire, and the durability of the electrode may deteriorate.

An object of the invention is to provide a wiring body of which the durability can be improved, a wiring board, a touch sensor, and a method for producing a wiring body.

Means for Solving Problem

[1] A wiring body according to the invention, includes: a first conductor layer including a first conductor wire; a resin layer covering the first conductor layer; and a second conductor layer disposed on the first conductor layer through the resin layer and including a second conductor wire, and satisfies the following Formula (1).

$$|H_1 - H_2| < T_1/3 \tag{1}$$

in the Formula (1), $H_1$ is a maximum height of the second conductor wire in a first region corresponding to the first conductor wire in a first predetermined sectional surface crossing the wiring body along the second conductor wire, $H_2$ is a minimum height of the second conductor wire in a second region which is adjacent to the first region and has the same width as that of the first region in the first predetermined sectional surface, and $T_1$ is a thickness of the first conductor wire in the first predetermined sectional surface.

[2] In the technology described above, the wiring body may further satisfy the following Formula (2).

$$|H_3 - H_4| < T_2/3 \tag{2}$$

in the Formula (2), $H_3$ is a maximum height of the resin layer in a third region corresponding to the first conductor wire in a second predetermined sectional surface of the wiring body crossing the resin layer which is exposed from the second conductor layer, $H_4$ is a minimum height of the resin layer in a fourth region which is adjacent to the third region and has the same width as that of the third region in the second predetermined sectional surface, and $T_2$ is a thickness of the first conductor wire in the second predetermined sectional surface.

[3] In the technology described above, a distance between the first conductor layer and the second conductor layer may be 1 time to 20 times the thickness of the first conductor layer.

[4] In the technology described above, the first conductor wire may have a tapered shape which narrows towards the second conductor layer side.

[5] In the technology described above, the second conductor wire may have a tapered shape which narrows towards a side separated from the first conductor layer.

[6] In the technology described above, a surface roughness of a surface on a side opposite to a first facing surface facing the second conductor wire may be rougher than a surface roughness of the first facing surface in the first conductor wire.

[7] In the technology described above, a surface roughness of a second facing surface facing the first conductor wire may be rougher than a surface roughness of a surface on a side opposite to the second facing surface in the second conductor wire.

[8] In the technology described above, the resin layer may include a protrusion protruding towards the second conductor layer, and the second conductor wire may be disposed on the protrusion.

[9] A wiring board according to the invention, includes: the wiring body described above; and a support that supports the wiring body described above.

[10] A touch sensor according to the invention, includes, the wiring board described above.

[11] A method for producing a wiring body of the invention, includes: a first process of filling a recessed portion of a first intaglio with a first conductive material, and of performing heating, or irradiating with an energy ray with respect to the first conductive material; a second process of disposing a first resin on the first conductive material; a third process of preparing an intermediate which is obtained by releasing the first resin and the first conductive material from the first intaglio plate; a fourth process of filling a recessed portion of a second intaglio plate with a second conductive material, and of performing heating, or irradiating with an energy ray with respect to the second conductive material; a fifth process of coating a surface of the intermediate on which the first resin is disposed with a second resin; a sixth process of disposing the second resin and the intermediate on the second conductive material such that the second resin is in contact with the second conductive material; and a seventh process of releasing the intermediate, the second resin, and the second conductive material from the second intaglio, in which the first conductive material includes a first linear portion, the second conductive material includes a second linear portion, and a relationship in a maximum height of the second linear portion, a minimum height of the second linear portion, and a thickness of the first linear portion satisfies the following Formula (3).

$$|H_5-H_6|<T_3/3 \quad (3)$$

in the Formula (3) described above, $H_5$ is a maximum height of the second linear portion in a fifth region corresponding to the first linear portion in a third predetermined sectional surface crossing the wiring body along the second linear portion, $H_6$ is a minimum height of the second linear portion in a sixth region which is adjacent to the fifth region and has the same width as that of the fifth region in the third predetermined sectional surface, and $T_3$ is a thickness of the first linear portion in the third predetermined sectional surface.

Effect of the Invention

According to the invention, the wiring body satisfies Formula (1) described above. Accordingly, even in a case where an external force or the like is applied to the wiring body, it is possible to prevent a stress from being concentrated on the second conductor wire, and thus, it is possible to improve the durability of the wiring body.

MODE(S) FOR CARRYING OUT THE INVENTION

Hereinafter, embodiments of the invention will be described on the basis of the drawings.

Figure 1:
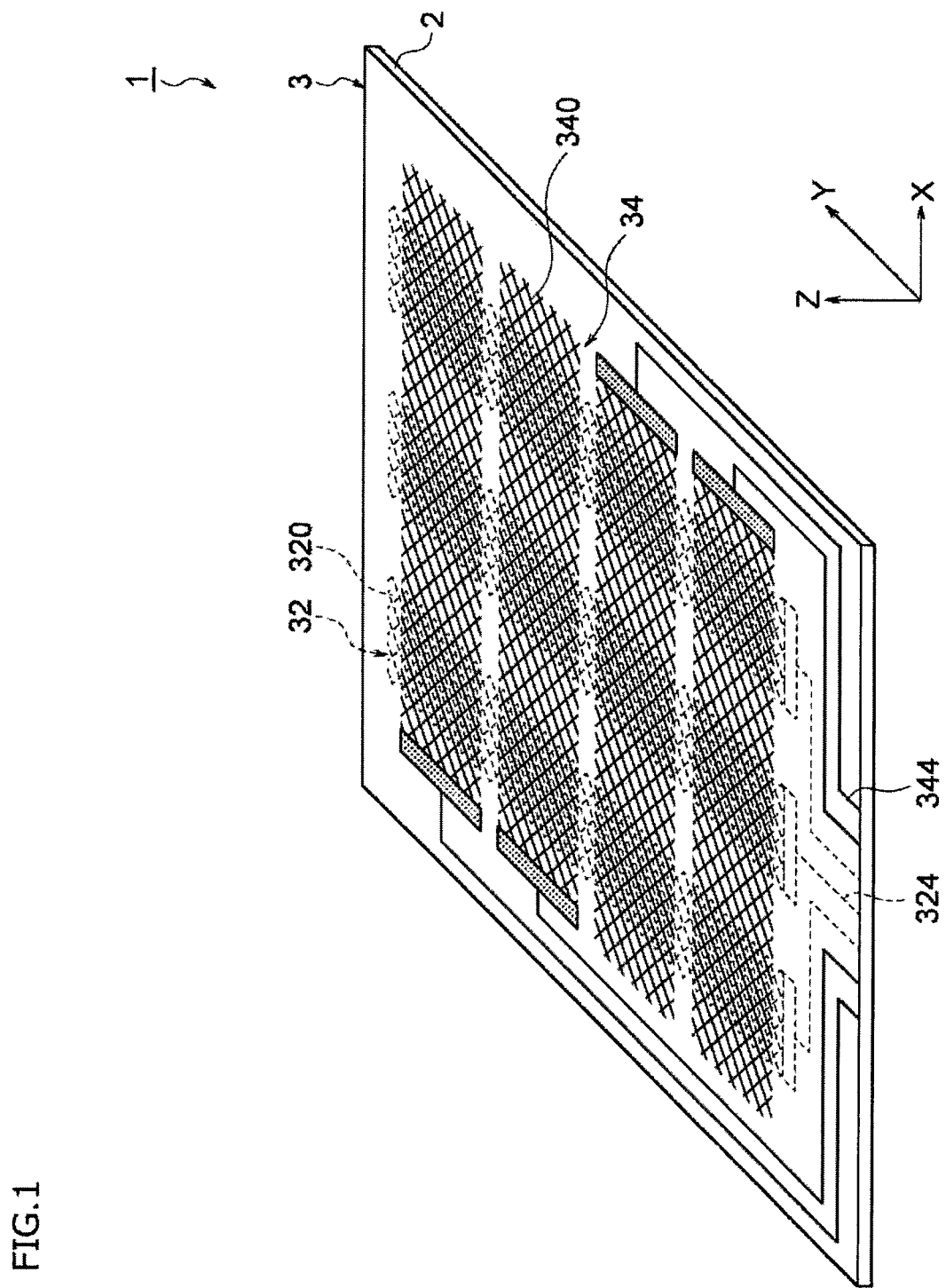
FIG. 1 is a perspective view illustrating a wiring board of an embodiment of the invention.
Figure 2:
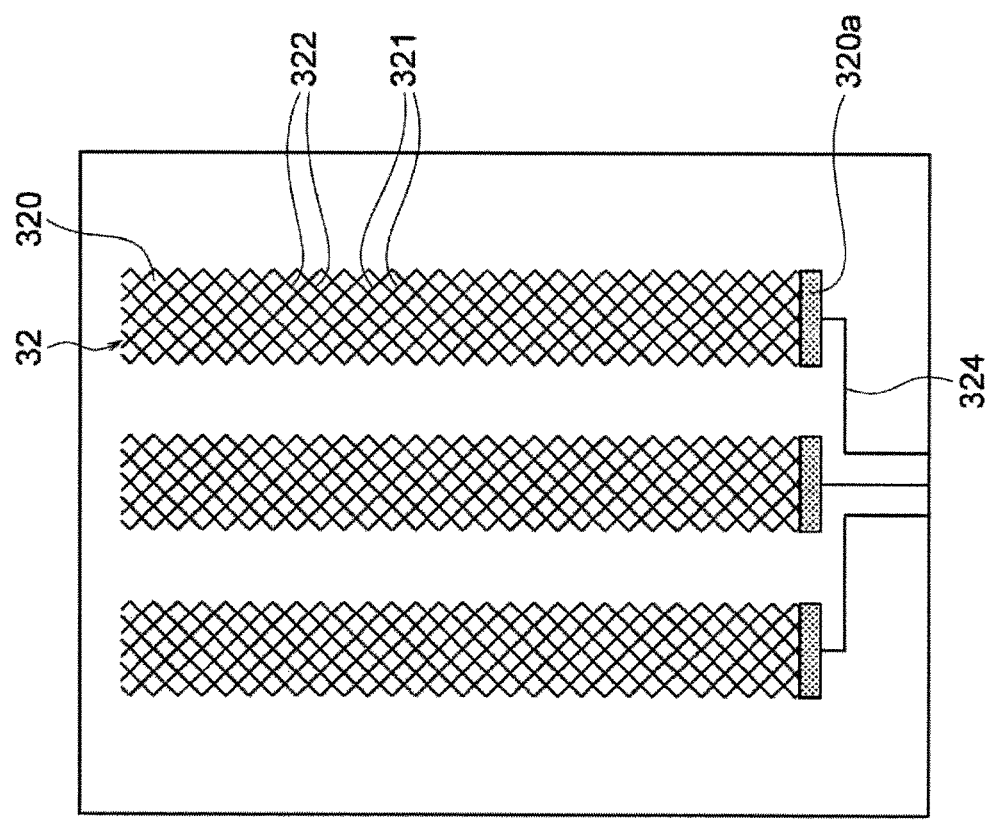
FIG. 2 is a plan view illustrating a first conductor layer of the embodiment of the invention.
Figure 3:
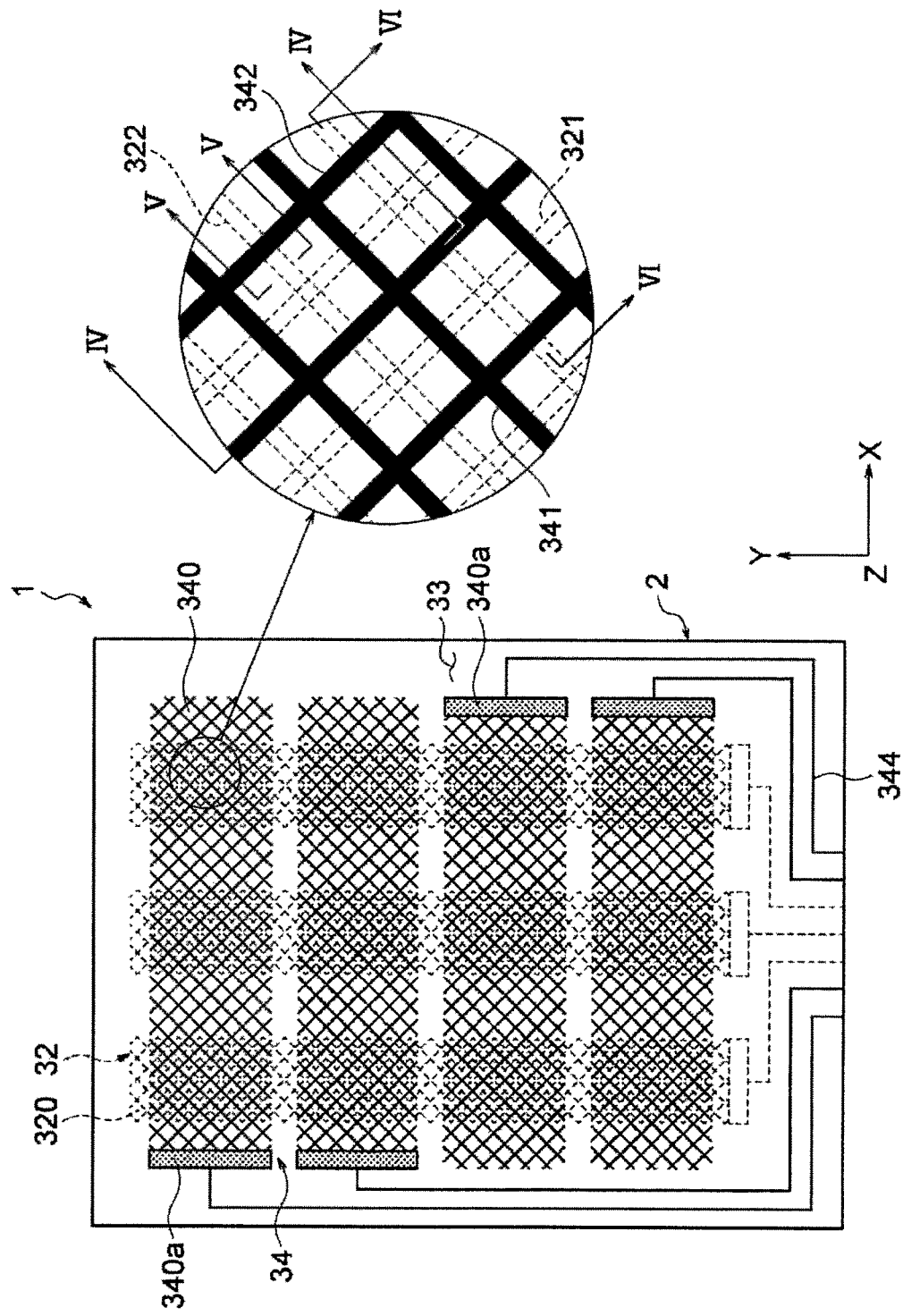
FIG. 3 is a plan view illustrating a second conductor layer of the embodiment of the invention.
Figure 4:
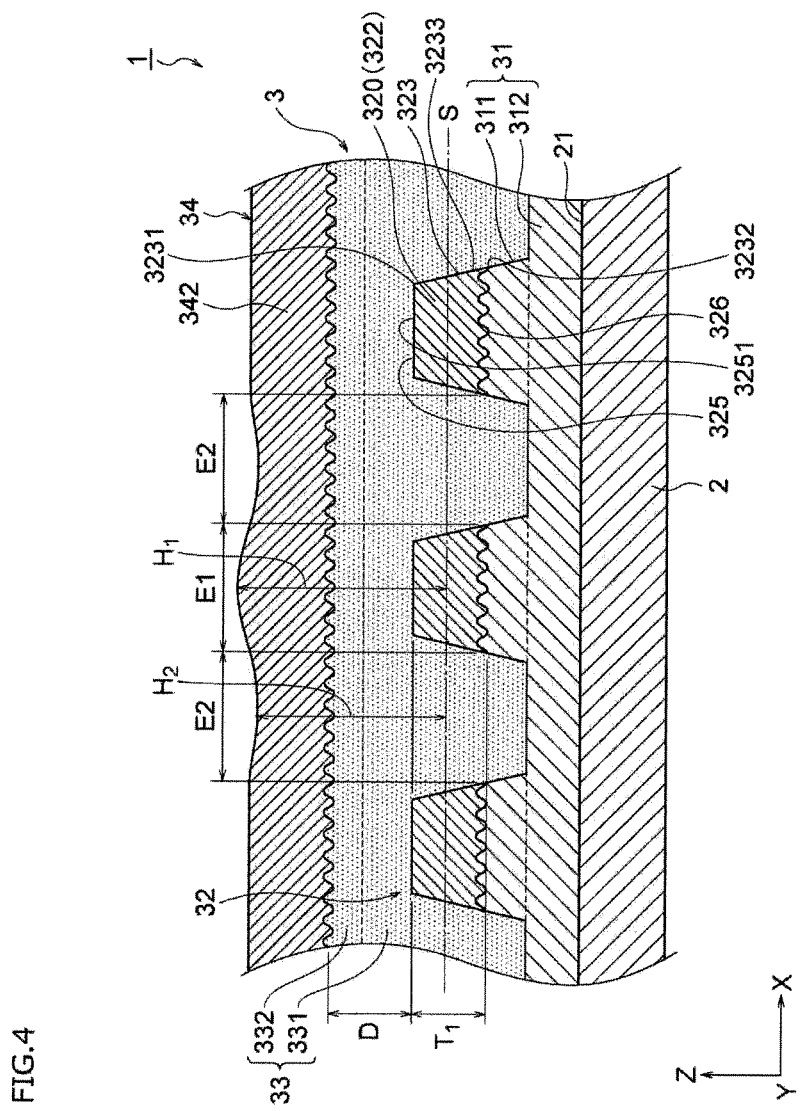
FIG. 4 is a sectional view taken along line IV-IV of FIG. 3.
Figure 5:
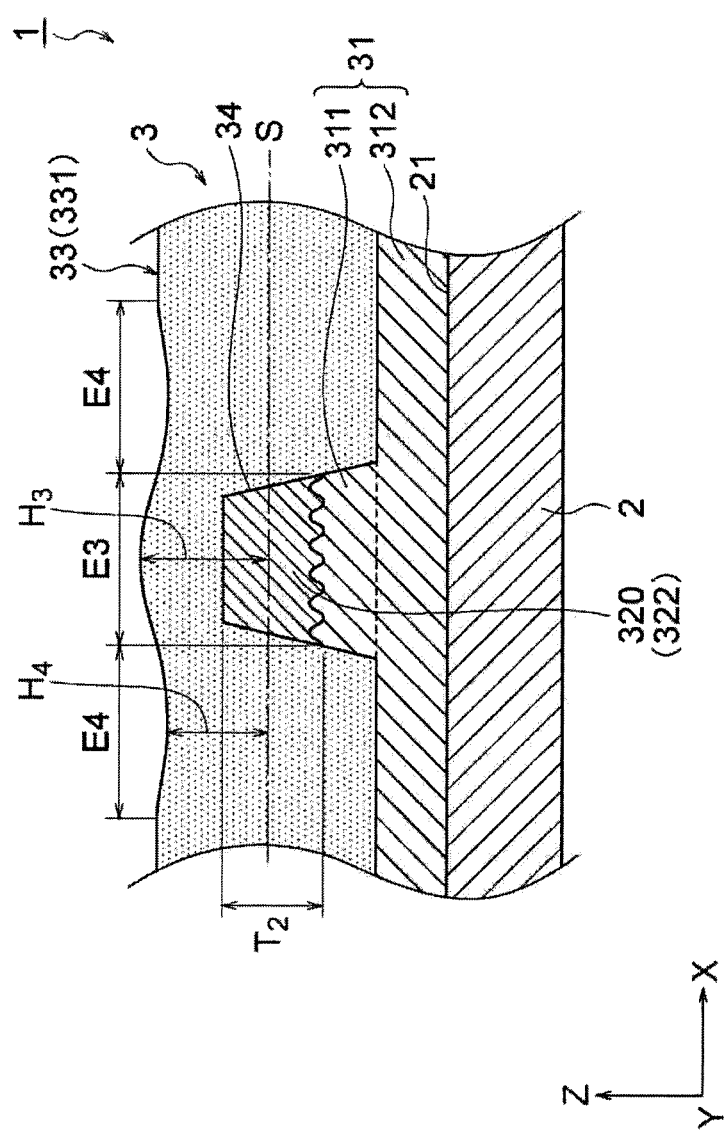
FIG. 5 is a sectional view taken along line V-V of FIG. 3.
Figure 6:
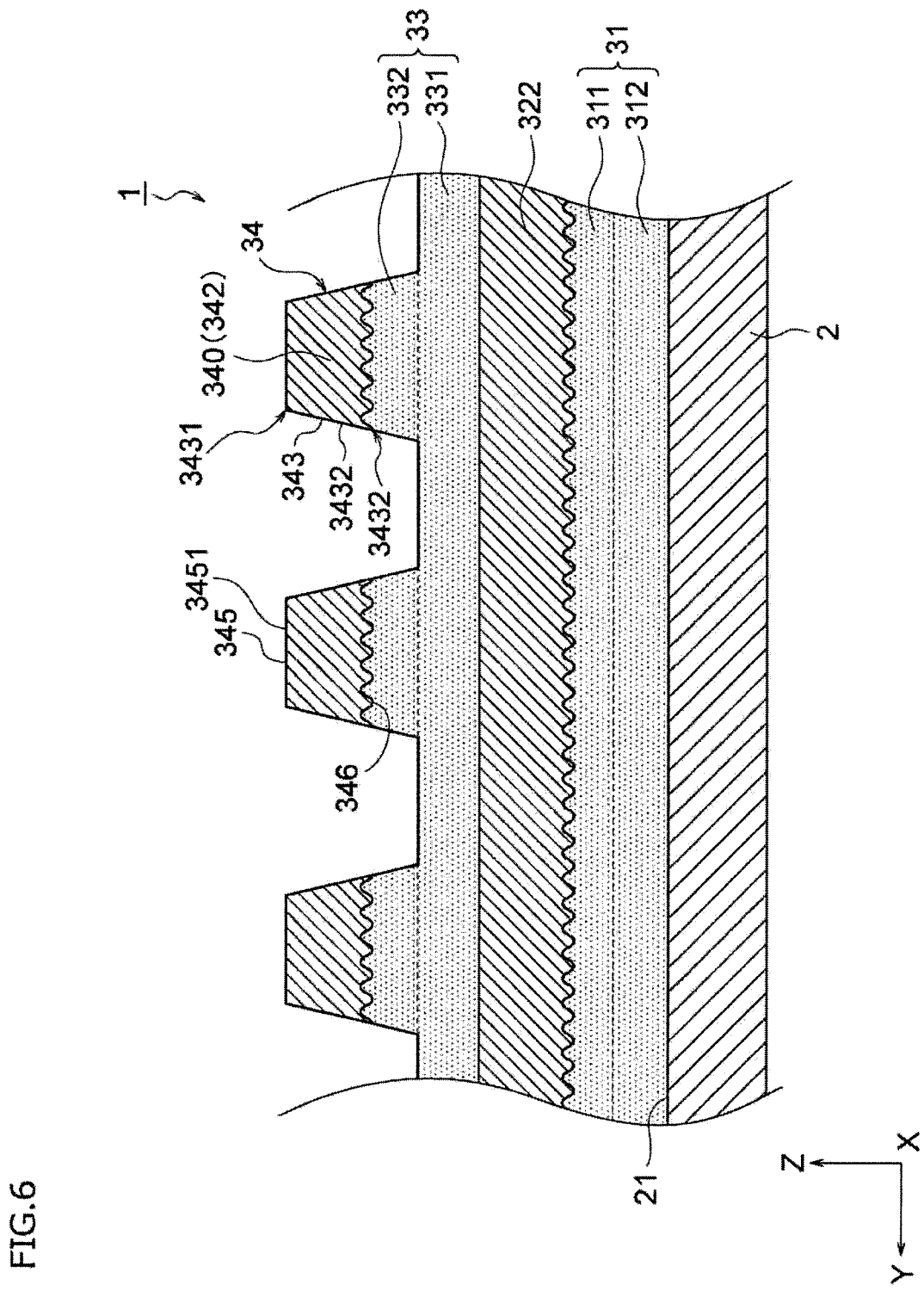
FIG. 6 is a sectional view taken along line VI-VI of FIG. 3.
Figure 7:
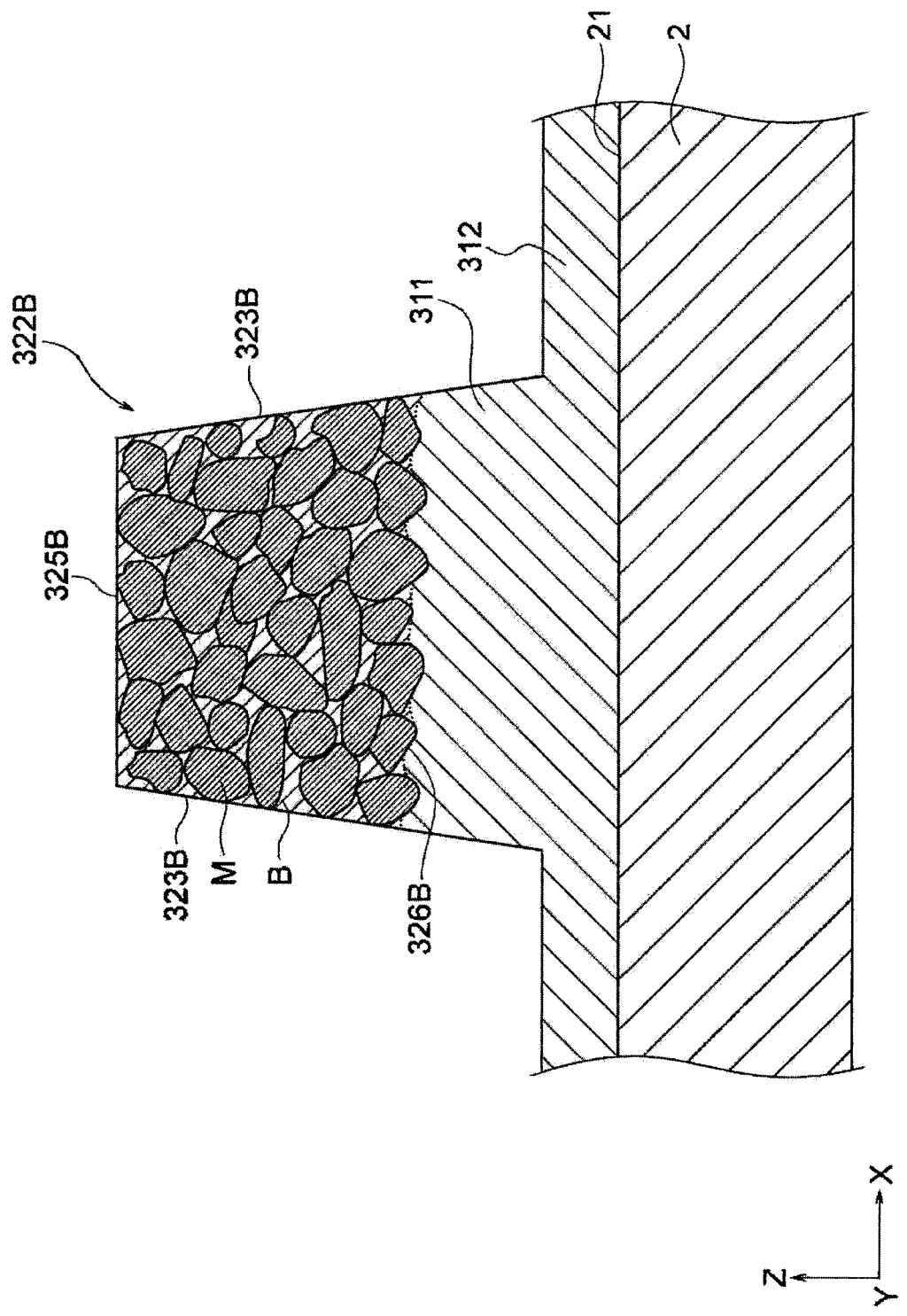
FIG. 7 is a sectional view for describing a first conductor wire of the embodiment of the invention.

FIG. 1 is a perspective view illustrating a wiring board of this embodiment, FIG. 2 is a plan view illustrating a first conductor layer of this embodiment, FIG. 3 is a plan view illustrating a second conductor layer of this embodiment, FIG. 4 is a sectional view taken along line IV-IV of FIG. 3, FIG. 5 is a sectional view taken along line V-V of FIG. 3, FIG. 6 is a sectional view taken along line VI-VI of FIG. 3, and FIG. 7 is a sectional view for describing a first conductor wire of the embodiment of the invention.

A wiring board 1 of this embodiment is used as an electrode base material or the like in a touch sensor such as an electrostatic capacitance type touch panel, and as illustrated in FIGS. 1 to 3, includes a substrate 2, and a wiring body 3 which is disposed on the substrate 2. The wiring body 3 includes an adhesive layer 31, a first conductor layer 32, a resin layer 33, and a second conductor layer 34. Furthermore, the application of the wiring board 1 is not particularly limited to the above description, and for example, the wiring board 1 is used as an input device having a function of detecting a touch position by being incorporated in a display device (not illustrated) or the like. The display device is not particularly limited, and a liquid crystal display, an organic EL display, electronic paper, and the like can be used as the display device.

As illustrated in FIG. 1, the substrate 2 has a rectangular shape, and is a transparent base material through which a visible light ray can be transmitted and which supports the first wiring body 3. Polyethylene terephthalate (PET), polyethylene naphthalate (PEN), a polyimide resin (PI), a polyether imide resin (PEI), polycarbonate (PC), polyether ether ketone (PEEK), a liquid crystal polymer (LCP), a cycloolefin polymer (COP), a silicone resin (SI), an acrylic resin, a phenolic resin, an epoxy resin, a green sheet, glass, and the like can be exemplified as a material configuring such a substrate 2. An easily adhesive layer or an optical adjustment layer may be formed on the substrate 2. Furthermore, the shape of the substrate 2 is not particularly limited. In addition, in a case where the substrate 2 is not required to have transparency, an opaque base material may be used as the material configuring the substrate 2. The substrate 2 of this embodiment corresponds to an example of a support of the invention.

The adhesive layer 31 as a first resin layer is a layer from which a visible light ray can be transmitted and which allows the substrate 2 and the first conductor layer 32 to adhere and to be fixed to each other, and as illustrated in FIG. 4 or FIG. 5, is disposed on the entire main surface 21 of the substrate 2. A UV curable resin such as an epoxy resin, an acrylic resin, a polyester resin, a urethane resin, a vinyl resin, a silicone resin, a phenolic resin, and a polyimide resin, a thermosetting resin or a thermoplastic resin, and the like can be exemplified as an adhesive material configuring the adhesive layer 31. As illustrated in FIG. 4, the adhesive layer 31 includes a support portion 311 supporting a first conductor wire 322 (described below), and a smooth portion 312 which is disposed between the support portion 311 and the main surface 21 of the substrate 2 and covers the main surface 21, and the support portion 311 and the smooth portion 312 are integrally formed. Furthermore, in a case where the adhesive layer 31 is not required to have transparency, an opaque resin may be used as the material configuring the adhesive layer 31.

As illustrated in FIG. 4, a sectional shape of the support portion 311 of this embodiment (a sectional shape in an extending direction of the first conductor wire 322 (described below)) is a shape which narrows towards a direction separated from the substrate 2 (a+Z direction in FIG. 2). In addition, a boundary between the support portion 311 and the first conductor wire 322 has a concave-convex shape corresponding to a concave-convex shape of a lower surface 326 of the first conductor wire 322. Such a concave-convex shape is formed on the basis of the surface roughness of the lower surface 326 of the first conductor wire 322. Furthermore, as illustrated in FIG. 6, the boundary between the support portion 311 and the first conductor wire 322 in the sectional surface along the extending direction of the first conductor wire 322 also has a concave-convex shape corresponding to the concave-convex shape of the lower surface 326 of the first conductor wire 322. The surface roughness of the lower surface 326 will be described below in detail. In FIG. 4 and FIG. 6, in order to describe the wiring body 3 of this embodiment to be easily understood, the concave-convex shape of the boundary between the support portion 311 and the first conductor wire 322 is exaggeratingly illustrated. Even though it is not particularly illustrated, a boundary between the support portion and a first conductor wire 321 described below also has an uneven shape corresponding to a concave-convex shape of a lower surface of the first conductor wire 321, as with the boundary between the support portion and the first conductor wire 322.

As illustrated in FIG. 4, the smooth portion 312 is disposed on the entire main surface 21 of the substrate 2 with approximately an even height (a thickness). The thickness of the smooth portion 312 can be set to be within a range of 5 µm to 100 µm, but is not particularly limited. The support portion 311 is disposed on the smooth portion 312, and thus, the adhesive layer 31 protrudes in the support portion 311, and the rigidity of the first conductor wire 322 in the support portion 311 is improved.

Furthermore, the adhesive layer 31 may be configured only of the support portion 311 by omitting the smooth portion 312 from the adhesive layer 31. In this case, the light transmittance of the entire wiring board 1 is improved, and thus, it is possible to improve the visibility of a touch panel or the like on which the wiring board 1 is mounted. The adhesive layer 31 of this embodiment corresponds to an example of a first resin of the invention.

The first conductor layer 32, for example, is a layer functioning as an electrode of a touch sensor or lead-out wire which is electrically connected to the electrode. Such a first conductor layer 32 is configured of conductive particles or a metal salt, and a binder resin. Examples of the conductive particles are capable of including a metal material such as silver or copper, nickel, tin, bismuth, zinc, indium, and palladium, and a carbon-based material such as graphite, carbon black (furnace black, acetylene black, and Ketjen black), a carbon nanotube, and a carbon nanofiber. Examples of the metal salt are capable of including the salts of the metals described above.

Conductive particles, for example, which have a diameter φ of 0.5 µm to 2 µm (0.5 µm≤φ≤2 µm) according to the width of a conductor pattern to be formed (the first conductor wires 321 and 322 or lead-out wire 324 (described below)), can be used as the conductive particles contained in the first conductor layer 32. Furthermore, it is preferable to use conductive particles having an average diameter φ of less than or equal to half of the width of the conductor pattern to be formed, from the viewpoint of stabilizing an electric resistance value of the first conductor layer 32. In addition, in a case where a carbon-based material is used as the conductive particles, it is preferable to use a particle whose specific surface area measured by a BET method is 20 m$^2$/g or more.

When relatively small electrical resistivity of a certain value or less is required for the first conductor layer 32, a metal material is preferably used as conductive powder. When relatively large electrical resistivity of the certain value or more is allowed for the conductor layer 32, a carbon-based material may be used as conductive particles is preferable in terms of improving haze or total light reflectance of a mesh film.

An acrylic resin, a polyester resin, an epoxy resin, a vinyl resin, a urethane resin, a phenolic resin, a polyimide resin, and the like can be exemplified as the binder resin.

Such a first conductor layer 32 is formed by applying and hardening a conductive paste. A conductive paste configured by mixing the conductive particles or the metal salt described above with a binder resin, water or a solvent, and various additives can be exemplified as a specific example of such a conductive paste. α-Terpineol, butyl carbitol acetate, butyl carbitol, 1-decanol, butyl cellosolve, diethylene glycol monoethyl ether acetate, tetradecane, and the like can be exemplified as the solvent contained in the conductive paste. Furthermore, the binder resin may be omitted from the material configuring the first conductor layer 32.

As illustrated in FIG. 2, the first conductor layer 32 of this embodiment includes a first electrode pattern 320 extending along a Y axis direction in FIG. 2, and the lead-out wire 324 connected to the first electrode pattern 320. In this embodiment, three first electrode patterns 320 are arranged approximately at regular intervals along an X axis direction in FIG. 2. Furthermore, the number and the arrangement of first electrode patterns 320 included in the first conductor layer 32 are not particularly limited to the above description.

The first electrode pattern 320 includes first conductor wires 321 and 322. As illustrated in FIG. 2, the first conductor wire 321 linearly extends, and the first conductor wire 322 also linearly extends. In addition, the first conductor wires 321 are arranged in parallel with each other approximately at regular intervals, and the first conductor wires 322 are also arranged in parallel with each other approximately at regular intervals. In this embodiment, the first conductor wire 321 and the first conductor wire 322 are orthogonal to each other, and thus, the first electrode pattern 320 is in the shape of a mesh having a rectangular lattice.

In this embodiment, the first conductor wires 321 and 322 are arranged by being respectively inclined at 45 degrees with respect to an extending direction of the first electrode pattern 320 (the Y axis direction in FIG. 2), and may be arranged by being respectively inclined at other angles (for example, 30 degrees). In addition, one of the first conductor wires 321 and 322 may be disposed by being inclined at 90 degrees with respect to the extending direction of the first electrode pattern 320 (the Y axis direction in FIG. 2).

Furthermore, the first conductor wires 321 and 322 may extend into the shape of a curve, or a linear portion and a curved portion may be mixed. In addition, in this embodiment, the first conductor wires 321 and 322 have wire widths which are approximately identical to each other, but the first conductor wires 321 and 322 may have wire widths which are different from each other.

Specifically, the width of the first conductor wires 321 and 322 is preferably 50 nm to 1000 µm, is more preferably within a range of 500 nm to 150 µm, is even more preferably within a range of 1 µm to 10 µm, and is still even more preferably within a range of 1 µm to 5 µm.

In this embodiment, a side portion 320a of the first electrode pattern 320, which is connected to the lead-out wire 324, is wider than the first conductor wires 321 and 322. Even though it is not particularly illustrated, a frame portion surrounding at least a part of a shape of reticulation, which is formed of the first conductor wires 321 and 322, may include the first electrode pattern 320. In this embodiment, the first conductor wires 321 and 322, the side portion 320a, and the lead-out wire 324 are integrally formed.

As illustrated in FIG. 4, a side portion 323 of the first conductor wire 322 and a side portion of the support portion 311 of the adhesive layer 31 are smoothly continuous, and thus, form one flat surface. The first conductor wire 322 has a tapered shape which narrows towards the second conductor layer 34 side, and thus, a sectional surface of the first conductor wire 322 (a sectional surface of the first conductor wire 322 in the extending direction) is approximately in the shape of a trapezoid. Furthermore, the sectional shape of the first conductor wire 322 is not particularly limited thereto. For example, the sectional surface of the first conductor wire 322 may be in the shape of a square, a rectangle, a triangle, and the like. Furthermore, in this embodiment, the first conductor wire 321 also has the same sectional shape as that of the first conductor wire 322.

In FIG. 4, an upper surface 325 (a first facing surface) of the first conductor wire 322 of this embodiment becomes a flattened surface (a smooth surface). Accordingly, it is possible to suppress the diffuse reflection of light which is incident from the outside. The upper surface 325 is positioned on a side opposite to the lower surface 326 of the first conductor wire 322. The upper surface 325 is substantially parallel to the main surface 21 of the substrate 2 (an upper surface of the smooth portion 312 of the adhesive layer 31).

The upper surface 325 includes a flat portion 3251 in the sectional surface of the first conductor wire 322 in a width direction. The flat portion 3251 is a linear portion which exists in the upper surface 325 (that is, a portion having a maximum curvature radius), in the sectional surface of the first conductor wire 322 in the width direction, and has a flatness of less than or equal to 0.5 µm. Furthermore, the flatness can be defined by a JIS method (JIS B0621 (1984)).

In this embodiment, the flatness of the flat portion 3251 is obtained by using a non-contact type measurement method using laser light. Specifically, a measurement target (specifically, the upper surface 325) is irradiated with strip-like laser light, and reflection light thereof is subjected to image formation on an imaging element (for example, a two-dimensional CMOS), and thus, the flatness is measured. A method in which in a flat surface of a target, a flat surface passing through each of three points which are maximally separated from each other is set, and a maximum value of a deviation thereof is calculated as the flatness (a maximum deviation type flatness) is used as a calculation method of the flatness. Furthermore, the measurement method or the calculation method of the flatness is not particularly limited to the above description. For example, the measurement method of the flatness may be a contact type measurement method using a dial gauge or the like. In addition, the calculation method of the flatness may be a method in which the value of a gap which can be formed at the time of interposing a flat surface, which becomes a target, between parallel flat surfaces is calculated as the flatness (a maximum inclination type flatness).

The flat portion 3251 of this embodiment is formed approximately on the entire upper surface 325. Furthermore, the flat portion 3251 may be formed on a part of the upper surface 325, but is not particularly limited to the above description. In this case, for example, the smooth portion may be formed in a region in which both ends of the upper surface are not included. In a case where the flat portion is formed on a part of the upper surface, the width of the flat portion is at least ½ with respect to the width of the upper surface.

The side portion 323 is positioned between the upper surface 325 and the lower surface 326. The side portion 323 is connected to the upper surface 325 in a first portion 3231, and is connected to the lower surface 326 in a second portion 3232. The first conductor wire 322 of this embodiment has a tapered shape which narrows towards the second conductor layer 34 side, and thus, the second portion 3232 is positioned on the outside from the first portion 3231. The side portion 323 of this embodiment is a linear surface extending on a virtual straight line (not illustrated) passing through the first portion 3231 and the second portion 3232, in the sectional surface of the first conductor wire 322 in the width direction.

Furthermore, the shape of the side portion 323 is not particularly limited to the above description. For example, the side portion 323 may protrude to the outside from the virtual straight line passing through the first portion 3231 and the second portion 3232, in the sectional surface of the first conductor wire 322 in the width direction. Thus, it is preferable that the side portion 323 has a shape in which the side portion 323 is not recessed inward from the virtual straight line passing through the first portion and the second portion (a shape in which the bottom of the first conductor wire 322 does not widen), in the sectional surface of the first conductor wire 322 in the width direction.

The side portion 323 of this embodiment includes a flat portion 3233 in the sectional surface of the first conductor wire 322 in the width direction. The flat portion 3233 is a linear portion which exists in the side portion 323 (that is, a portion having a maximum curvature radius), in the sectional surface of the first conductor wire 322 in the width direction, and has a flatness of less than or equal to 0.5 µm. In this embodiment, the flat portion 3233 is formed approximately in the entire side portion 323. Furthermore, the shape of the flat portion 3233 is not particularly limited to the above description, and the flat portion 3233 may be formed in a part of the side portion 323.

An angle $\theta_1$ between the side portion 323 and the upper surface 325 is preferably within a range of 90° to 170° ($90° \leq \theta_1 \leq 170°$), and is more preferably within a range of 90° to 120° ($90° \leq \theta_1 \leq 120°$), from the viewpoint of suppressing the diffuse reflection of light on the side portion 323. In this embodiment, in one first conductor wire 322, an angle between one side portion 323 and the upper surface 325 and an angle between the other side portion 323 and the upper surface 325 are substantially identical to each other.

In this embodiment, it is preferable that the surface roughness of the lower surface 326 of the first conductor wire 322 in FIG. 4 is rougher than the surface roughness of the upper surface 325 (the first facing surface) of the first conductor wire 322 in FIG. 4, from the viewpoint of rigidly fixing the first conductor wire 322 to the adhesive layer 31. In this embodiment, the upper surface 325 includes the flat portion 3251, and thus, a relative relationship of the surface roughness of the first conductor wire 322 described above (a relationship in which the surface roughness of the lower surface 326 is relatively rougher than the surface roughness of the upper surface 325) is established. Specifically, it is preferable that surface roughness Ra of the lower surface 326 of the first conductor wire 322 is approximately within a range of 0.1 µm to 3 µm, whereas the surface roughness Ra of the upper surface 325 is approximately within a range of 0.001 µm to 1.0 µm. Furthermore, it is more preferable that the surface roughness Ra of the lower surface 326 of the first conductor wire 322 is within a range of 0.1 µm to 0.5 µm, and it is more preferable that the surface roughness Ra of the upper surface 325 is within a range of 0.001 µm to 0.3 µm. In addition, a ratio of the surface roughness of the upper surface 325 to the surface roughness of the lower surface 326 (the surface roughness of the upper surface 325 with respect to the surface roughness of the lower surface 326) is preferably greater than or equal to 0.01 and less than 1, and is more preferably greater than or equal to 0.1 and less than 1. In addition, it is preferable that the surface roughness of the upper surface 325 is less than or equal to ⅕ of the width (a maximum width) of the first conductor wire 322. Furthermore, such surface roughness can be measured by a JIS method (JIS B0601 (revised on Mar. 21, 2013)). The surface roughness of the lower surface 326 and the surface roughness of the upper surface 325 may be measured along the width direction of the first conductor wire 322, or may be measured along the extending direction of the first conductor wire 322.

Incidentally, as described in the JIS method (JIS B0601 (revised on Mar. 21, 2013)), the "surface roughness Ra" herein indicates "arithmetic average roughness Ra". The "arithmetic average roughness Ra" indicates a roughness parameter which is obtained by blocking a long wavelength component (a waviness component) from a sectional curve. The waviness component is separated from the sectional curve on the basis of measurement conditions required for obtaining a form (for example, the dimension and the like of the target).

In addition, in this embodiment, the side portion 323 also includes the flat portion 3233. For this reason, the surface roughness of the lower surface 326 is relatively rougher than the surface roughness of the side portion 323. Specifically, it is preferable that the surface roughness Ra of the lower surface 326 of the first conductor wire 322 is within a range of 0.1 μm to 3 μm, whereas the surface roughness Ra of the side portion 323 is within a range of 0.001 μm to 1.0 μm.

In this embodiment, the surface roughness of the lower surface 326 is relatively rougher than the surface roughness of the upper surface 325 and the surface roughness of the side portion 323, and thus, the diffuse reflectance of a wiring body 1 on surfaces except for the lower surface 326 (that is, the upper surface 325 and the side portion 323) is relatively smaller than the diffuse reflectance of the wiring body 1 on the lower surface 326 side. A ratio of the diffuse reflectance of the wiring body 1 on the side of surfaces except for the lower surface 326 to the diffuse reflectance of the wiring body 1 on the lower surface 326 side (the diffuse reflectance of the wiring body 1 on the side of surfaces except for lower surface 326 with respect to the diffuse reflectance of the wiring body 1 on the lower surface 326 side) is preferably greater than or equal to 0.1 and less than 1, and is more preferably greater than or equal to 0.3 and less than 1, from the viewpoint of improving the visibility of the wiring body 1.

An example of the shape of a first conductor wire 322B having a relative relationship of the surface roughness between the lower surface described above and the surfaces except for the lower surface will be described with reference to FIG. 7. As illustrated in FIG. 7, in the first conductor wire 322B configured of conductive particles M and a binder resin B, conductive particles M are dispersed in the binder resin B. In a sectional surface of the first conductor wire 322B in a width direction, an uneven lower surface 326B in which a part of the conductive particles M protrudes from the binder resin B, and a smooth upper surface 325B and a smooth side portion 323B in which the binder resin B is inserted between the conductive particles M and the binder resin B covers the conductive particles M, are formed. Furthermore, in the upper surface 325B and the side portion 323B, the conductive particles M are covered with the binder resin B, and thus, the electrical insulating properties between the adjacent first conductor wires 322B are improved, and the occurrence of a migration is suppressed.

In a shape illustrated in FIG. 7, a part of the conductive particles M protrudes from the binder resin B in the lower surface 326B, and thus, the surface roughness of the lower surface 326B comparatively increases. In contrast, the conductive particles M are covered with the binder resin B in the upper surface 325B, and thus, the surface roughness of the upper surface 325B comparatively decreases. For this reason, the surface roughness of the lower surface 326B is relatively rougher than the surface roughness of the upper surface 325B.

In addition, the conductive particles M are covered with the binder resin B in the side portion 323B, and thus, the surface roughness of the side portion 323B comparatively decreases. For this reason, the surface roughness of the lower surface 326B is relatively rougher than the surface roughness of the side portion 323B.

Furthermore, the first conductor wire 321 has the same configuration as that of the first conductor wire 322 except for only the extending direction of the first conductor wire 322, and thus, the detailed description of the same configuration will be omitted.

The resin layer 33 of this embodiment is capable of allowing a visible light ray to transmit therethrough, and is configured of a UV curable resin such as an epoxy resin, an acrylic resin, a polyester resin, a urethane resin, a vinyl resin, a silicone resin, a phenolic resin, and a polyimide resin, a thermosetting resin or a thermoplastic resin, and the like. The resin layer 33 of this embodiment correspond to an example of a resin layer and a second resin of the invention. Furthermore, in a case where the resin layer 33 is not required to have transparency, an opaque resin may be used as the material configuring the resin layer 33.

As illustrated in FIG. 4 to FIG. 6, the resin layer 33 includes a main portion 331 including approximately a smooth upper surface and disposed corresponding to the entire main surface 21 of the substrate 2, and a protrusion 332 disposed on the main portion 331. As illustrated in FIG. 4 or FIG. 5, the main portion 331 covers the first conductor layer 32 and the adhesive layer 31 except for an adhesive surface with respect to the first electrode pattern 320. The protrusion 332 protrudes towards the second conductor layer 34 side (the +Z direction side), and is formed corresponding to a second electrode pattern 340 of the second conductor layer 34. The main portion 331 and the protrusion 332 of this embodiment are integrally configured.

As illustrated in FIG. 6, a sectional shape of the protrusion 332 of this embodiment (a sectional shape in an extending direction of a second conductor wire 342 (described below)) is a shape which narrows towards a direction separated from the substrate 2 (a +Z direction in FIG. 6). The protrusion 332 is disposed on the main portion 331, and thus, the rigidity of the second conductor wire 342 in the protrusion 332 is improved. In addition, a boundary between the protrusion 332 and the second conductor wire 342 has a concave-convex shape corresponding to a concave-convex shape of a lower surface 346 of the second conductor wire 342. Such a concave-convex shape is formed on the basis of the surface roughness of the lower surface 346 of the second conductor wire 342. Furthermore, as illustrated in FIG. 4, the boundary between the protrusion 332 and the second conductor wire 342 in the sectional surface along the extending direction of the second conductor wire 342 also has a concave-convex shape corresponding to the concave-convex shape of the lower surface 346 of the second conductor wire 342. The surface roughness of the lower surface 346 will be described below in detail. In FIG. 4 and FIG. 6, in order to describe the wiring body 3 of this embodiment to be easily understood, the uneven shape of the boundary between the protrusion 332 and the second conductor wire 342 is exaggeratingly illustrated. Even though it is not particularly illustrated, a boundary between the convex portion and a second conductor wire 341 (described below) also has an uneven shape corresponding to the concave-convex shape of the lower surface of the second conductor wire 341, as with the boundary between the protrusion 332 and the second conductor wire 342.

The second conductor layer 34, for example, is a layer functioning as an electrode of a touch sensor or lead-out wire which is electrically connected to the electrode. Such a second conductor layer 34 is formed by being coated with a conductive paste. The same conductive paste as the conductive paste configuring the first conductor layer 32 can be used as the conductive paste configuring the second conductor layer 34. As illustrated in FIG. 3, the second conductor layer 34 of this embodiment includes the second electrode pattern 340 which extends along an X axis direction in FIG. 3, and lead-out wire 344 which is connected to the second electrode pattern 340. In this embodiment, four second electrode patterns 340 are arranged approximately at regular intervals along a Y axis direction in FIG. 3. In this embodiment, two second electrode patterns 340 arranged on a +Y axis direction side in FIG. 3 are connected to the lead-out wire 344 on a −X axis direction side in FIG. 3, and two second electrode patterns 340 arranged on a −Y axis direction side in FIG. 3 are connected to the lead-out wire 344 on a +X axis direction side in FIG. 3. Furthermore, the number and the arrangement of second electrode patterns included in the second conductor layer 34 are not particularly limited to the above description.

The second electrode pattern 340 includes the second conductor wires 341 and 342. As illustrated in FIG. 3, the second conductor wire 341 linearly extends, and the second conductor wire 342 also linearly extends. In addition, the second conductor wires 341 are arranged in parallel with each other approximately at regular intervals, and the second conductor wires 342 are also arranged in parallel with each other approximately at regular intervals. In this embodiment, the second conductor wire 341 and the second conductor wire 342 are orthogonal to each other, and thus, the second electrode pattern 340 is in the shape of a mesh having a rectangular lattice. Furthermore, in this embodiment, the shape of a unit lattice configuring the mesh-like shape of the first electrode pattern 320 and the shape of a unit lattice configuring the mesh-like shape of the second electrode pattern 340 are approximately identical to each other, but are not particularly limited thereto.

In this embodiment, the second conductor wires 341 and 342 are arranged by being respectively inclined at 45 degrees with respect to an extending direction of the second electrode pattern 340 (the X axis direction in FIG. 3), and may be arranged by being respectively inclined at other angles (for example, 30 degrees). In addition, one of the second conductor wires 341 and 342 may be disposed by being inclined at 90 degrees with respect to the extending direction of the second electrode pattern 340 (the X axis direction in FIG. 3).

Furthermore, the second conductor wires 341 and 342 may extend into the shape of a curve, or a linear portion and a curved portions may be mixed. In addition, an angle between the second conductor wire 341 and the second conductor wire 342 is not particularly limited to a right angle. In this embodiment, the second conductor wires 341 and 342 have wire widths which are approximately identical to each other, but the second conductor wires 341 and 342 may have wire widths which are different from each other.

The width of such second conductor wires 341 and 342 is preferably within a range of 50 nm to 1000 µm, is more preferably within a range of 500 nm to 150 µm, is even more preferably within a range of 1 µm to 10 µm, and is still even more preferably within a range of 1 µm to 5 µm, as with the width of the first conductor wires 321 and 322.

In this embodiment, a side portion 340a of the second electrode pattern 340, which is connected to the lead-out wire 344, is wider than the second conductor wires 341 and 342. Even though it is not particularly illustrated, a frame portion surrounding at least a part of the mesh-like shape formed of the second conductor wires 341 and 342 may include the second electrode pattern 340. In this embodiment, the second conductor wires 341 and 342, the side portion 340a, and the lead-out wire 344 are integrally formed.

As illustrated in FIG. 6, a side portion 343 of the second conductor wire 342 and a side portion of the protrusion 332 of the resin layer 33 are smoothly continuous, and thus, form one flat surface. The second conductor wire 342 has a tapered shape which narrows towards a side separated from the first conductor layer (the +Z direction side in FIG. 6), and thus, a sectional surface of the second conductor wire 342 (a sectional surface of the second conductor wire 342 in the extending direction) is approximately in the shape of a trapezoid. Furthermore, the sectional shape of the second conductor wire 342 is not particularly limited thereto. For example, the sectional surface of the second conductor wire 342 may be in the shape of a square, a rectangle, a triangle, and the like. Furthermore, in this embodiment, the second conductor wire 341 also has the same sectional shape as that of the second conductor wire 342.

In FIG. 6, an upper surface 345 of the second conductor wire 342 of this embodiment is a flattened surface (a smooth surface). Accordingly, it is possible to suppress the diffuse reflection of the light which is incident from the outside. The upper surface 345 is positioned on a side opposite to the lower surface 346 in the second conductor wire 342. The upper surface 345 is substantially parallel to the main surface of the substrate 2 (the upper surface of the smooth portion 312 of the adhesive layer 31 or an upper surface of the main portion 331 of the resin layer 33).

The upper surface 345 includes a flat portion 3451 in the sectional surface of the second conductor wire 342 in a width direction. The flat portion 3451 is a linear portion existing in the upper surface 345 (that is, a portion having a maximum curvature radius), in the sectional surface of the second conductor wire 342 in the width direction, and has a flatness of less than or equal to 0.5 µm.

The flat portion 3451 of this embodiment is formed approximately on the entire upper surface 345. Furthermore, the flat portion 3451 may be formed on a part of the upper surface 345, but is not particularly limited to the above description. In this case, for example, the flat portion may be formed in a region in which both ends of the upper surface are not included. In a case where the flat portion is formed on a part of the upper surface, the width of the flat portion is at least ½ with respect to the width of the upper surface.

The side portion 343 is positioned between the upper surface 345 and the lower surface 346. The side portion 343 is connected to the upper surface 345 in a first portion 3431, and is connected to the lower surface 346 in a second portion 3432. The second conductor wire 352 of this embodiment has a tapered shape which narrows towards a side separated from the first conductor layer 32, and thus, the second portion 3432 is positioned on the outside from the first portion 3431. The side portion 343 is a linear surface extending on a virtual straight line (not illustrated) which passes through the first portion 3431 and the second portion 3432, in the sectional surface of the second conductor wire 342 in the width direction.

Furthermore, the shape of the side portion 343 is not particularly limited to the above description. For example, the side portion 343 may protrude to the outside from the virtual straight line which passes through the first portion 3431 and the second portion 3432, in the sectional surface of the second conductor wire 342 in the width direction. Thus, it is preferable that the side portion 343 has a shape which is not recessed to the inside from the virtual straight line passing through the first portion and the second portion (a shape in which the bottom of the second conductor wire 342 does not widen), in the sectional surface of the second conductor wire 342 in the width direction.

The side portion 343 of this embodiment includes a flat portion 3433 in the sectional surface of the second conductor wire 342 in the width direction. The flat portion 3433 is a linear portion (that is, a portion having a maximum curvature radius), in the sectional surface of the second conductor wire 342 in the width direction, and has a flatness of less than or equal to 0.5 µm. In this embodiment, the flat portion 3433 is formed approximately in the entire side portion 343. Furthermore, the shape of the flat portion 3433 is not particularly limited to the above description, and the flat portion 3433 may be formed in a part of the side portion 343.

An angle $\theta_2$ between the side portion 343 and the upper surface 345 is preferably within a range of 90° to 170° (90°≤$\theta_2$≤170°), and is more preferably within a range of 90° to 120° (90°≤$\theta_2$≤120°), from the viewpoint of suppressing the diffuse reflection of light on the side portion 343. In this embodiment, in one second conductor wire 342, an angle between one side portion 343 and the upper surface 345 and an angle between the other side portion 343 and the upper surface 345 are substantially identical to each other.

In this embodiment, both of the upper surface 325 of the first conductor wire 322 in FIG. 4 and the upper surface 345 of the second conductor wire 342 in FIG. 6 is the flattened surface (the smooth surface), and thus, it is possible to further suppress the diffuse reflection of the light which is incident from the outside. In addition, in this embodiment, it is preferable that the surface roughness of the lower surface 346 of the second conductor wire 342 in FIG. 6 is rougher than the surface roughness of the upper surface 345 of the second conductor wire 342 in FIG. 6, from the viewpoint of rigidly fixing the second conductor wire 342 to the resin layer 33. In this embodiment, the upper surface 345 includes the flat portion 3451, and thus, a relative relationship of the surface roughness of the second conductor wire 342 described above (a relationship in which the surface roughness of the lower surface 346 is relatively rougher than the surface roughness of the upper surface 345) is established. Specifically, it is preferable that the surface roughness Ra of the lower surface 346 (a second facing surface) of the second conductor wire 342 is within a range of 0.1 µm to 3 µm, whereas the surface roughness Ra of the upper surface 345 is within a range of 0.001 µm to 1.0 µm. Furthermore, it is more preferable that the surface roughness Ra of the lower surface 346 of the second conductor wire 342 is within a range of 0.1 µm to 0.5 µm, and it is more preferable that the surface roughness Ra of the upper surface 345 is within a range of 0.001 µm to 0.3 µm. In addition, a ratio of the surface roughness of the upper surface 345 to the surface roughness of the lower surface 346 (the surface roughness of the upper surface 345 with respect to the surface roughness of the lower surface 346) is preferably greater than or equal to 0.01 and less than 1, and is more preferably greater than or equal to 0.1 and less than 1. In addition, it is preferable that the surface roughness of the upper surface 345 is less than or equal to ⅕ of the width (a maximum width) of the second conductor wire 342. Furthermore, such surface roughness can be measured by a JIS method (JIS B0601 (revised on Mar. 21, 2013)). The surface roughness of the upper surface 345 and the lower surface 346 may be measured along the width direction of the second conductor wire 342, or may be measured along the extending direction of the second conductor wire 342.

In addition, in this embodiment, the side portion 343 also includes the flat portion 3433. For this reason, the surface roughness of the lower surface 346 is relatively rougher than the surface roughness of the side portion 343. Specifically, it is preferable that the surface roughness Ra of the lower surface 346 of the second conductor wire 342 is within a range of 0.1 µm to 3 µm, whereas the surface roughness Ra of the side portion 343 is within a range of 0.001 µm to 1.0 µm.

In this embodiment, the surface roughness of the lower surface 346 is relatively rougher than the surface roughness of the upper surface 345 and the surface roughness of the side portion 343, and thus, the diffuse reflectance of the wiring body 1 on a side of surfaces except for the lower surface 346 (that is, the upper surface 345 and the side portion 343) is relatively smaller than the diffuse reflectance of the wiring body 1 on the lower surface 326 side. A ratio of the diffuse reflectance of the wiring body 1 on the side of surfaces except for the lower surface 346 to the diffuse reflectance of the wiring body 1 on the lower surface 346 side (the diffuse reflectance of the wiring body 1 on the side of surfaces except for lower surface 346 with respect to the diffuse reflectance of the wiring body 1 on the lower surface 346 side) is preferably greater than or equal to 0.1 and less than 1, and is more preferably greater than or equal to 0.3 and less than 1, from the viewpoint of improving the visibility of the wiring body 1.

Examples of the shape of the second conductor wire having a relative relationship of the surface roughness between the lower surface described above and the surfaces except for the lower surface are capable of including the same shape as that of the first conductor wire 322B illustrated in FIG. 7. That is, even though the illustration is omitted, in the sectional surface of the second conductor wire in the width direction, an concave-convex lower surface in which a part of the conductive particles protrudes from the binder resin, and a smooth upper surface and a smooth side portion in which the binder resin is inserted between the conductive particles and the binder resin covers the conductive particles, are formed. Accordingly, the surface roughness of the lower surface is relatively rougher than the surface roughness of the upper surface. In addition, the surface roughness of the lower surface is relatively rougher than the surface roughness of the side portion.

Furthermore, the second conductor wire 341 has the same configuration as that of the second conductor wire 342 except for only the extending direction of the second conductor wire 342, and thus, the detailed description of the same configuration will be omitted.

In addition, the wiring board 1 of this embodiment satisfies Formula (4) and Formula (5) described below.

$$|H_1-H_2|<T_1/3 \qquad (4)$$

$|H_3-H_4|<T_2/3$ (5)

Here, in Formula (4) described above, $H_1$ is a maximum height of the second conductor wire in a first region E1 corresponding to the first conductor wire 322 (a height from an average surface S of the first conductor layer) in a first predetermined sectional surface crossing the wiring body 3 along the second conductor wire 342 (a sectional surface corresponding to FIG. 4), $H_2$ is a minimum height of the second conductor wire 342 in a second region E2 which is adjacent to the first region E1 and has the same width as that of the first region E1 (a height from the average surface S of the first conductor layer) in the first predetermined sectional surface, and $T_1$ is an average thickness of the first conductor wire 322 in the first predetermined sectional surface.

In addition, in Formula (5) described above, $H_3$ is a maximum height of the resin layer 33 in a third region E3 corresponding to the first conductor wire 322 (a height from the average surface S of the first conductor layer) in a second predetermined sectional surface of the wiring body 3 crossing the resin layer exposed from the second conductor layer 34 (a sectional surface corresponding to FIG. 5), $H_4$ is a minimum height of the resin layer 33 in a fourth region E4 which is adjacent to the third region E3 and has the same width as that of the third region E3 (a height from the average surface S of the first conductor layer) in the second predetermined sectional surface, and $T_2$ is an average thickness of the first conductor wire 322 in the second predetermined sectional surface. Furthermore, the wiring board 1 may not satisfy Formula (5) described above, but it is preferable that the wiring board 1 satisfies Formula (5) described above, from the viewpoint of improving the durability of the wiring board 1.

In addition, the thicknesses $T_1$ and $T_2$ of the first conductor layer 32 are preferably within a range of 100 nm to 20 μm, are more preferably within a range of 500 nm to 10 μm, and are even more preferably within a range of 1 μm to 5 μm. The heights $H_1$ and $H_2$ of the second conductor wire 342 are preferably within a range of 1 μm to 100 μm, are more preferably within a range of 5 μm to 100 μm, and are even more preferably within a range of 20 μm to 70 μm. The heights $H_3$ and $H_4$ of the resin layer 33 are preferably within a range of 1 μm to 100 μm, are more preferably within a range of 5 μm to 100 μm, and are even more preferably within a range of 20 μm to 70 μm. In this case, it is possible to maintain the light transmittance of the wiring board 1 while improving electric properties. $|H_1-H_2|$ is preferably less than or equal to 5 μm, is more preferably less than or equal to 3 μm, and is even more preferably less than or equal to 1 μm. $|H_3-H_4|$ is preferably less than or equal to 5 μm, is more preferably less than or equal to 3 μm, and is even more preferably less than or equal to 1 μm. In this case, it is possible to further improve the durability of the wiring body 3.

In addition, in the wiring board 1 of this embodiment, a distance D between the first conductor layer 32 and the second conductor layer 34 (in the sectional view, a distance from an upper end of the first conductor layer 32 to a lower end of the second conductor layer 34) is 5 μm. It is preferable that the distance D is 1 time to 20 times the thickness $T_1$ of the first conductor layer 32 ($T_1 \leq D \leq 20 \times T_1$). In this case, it is possible to maintain the light transmittance of the wiring board 1 while improving the electric properties.

Next, a manufacturing method of the wiring board 1 of this embodiment will be described. FIG. 8(A) to FIG. 8(J) are sectional views for describing the manufacturing method of the wiring board 1 of this embodiment.

Figure 8:
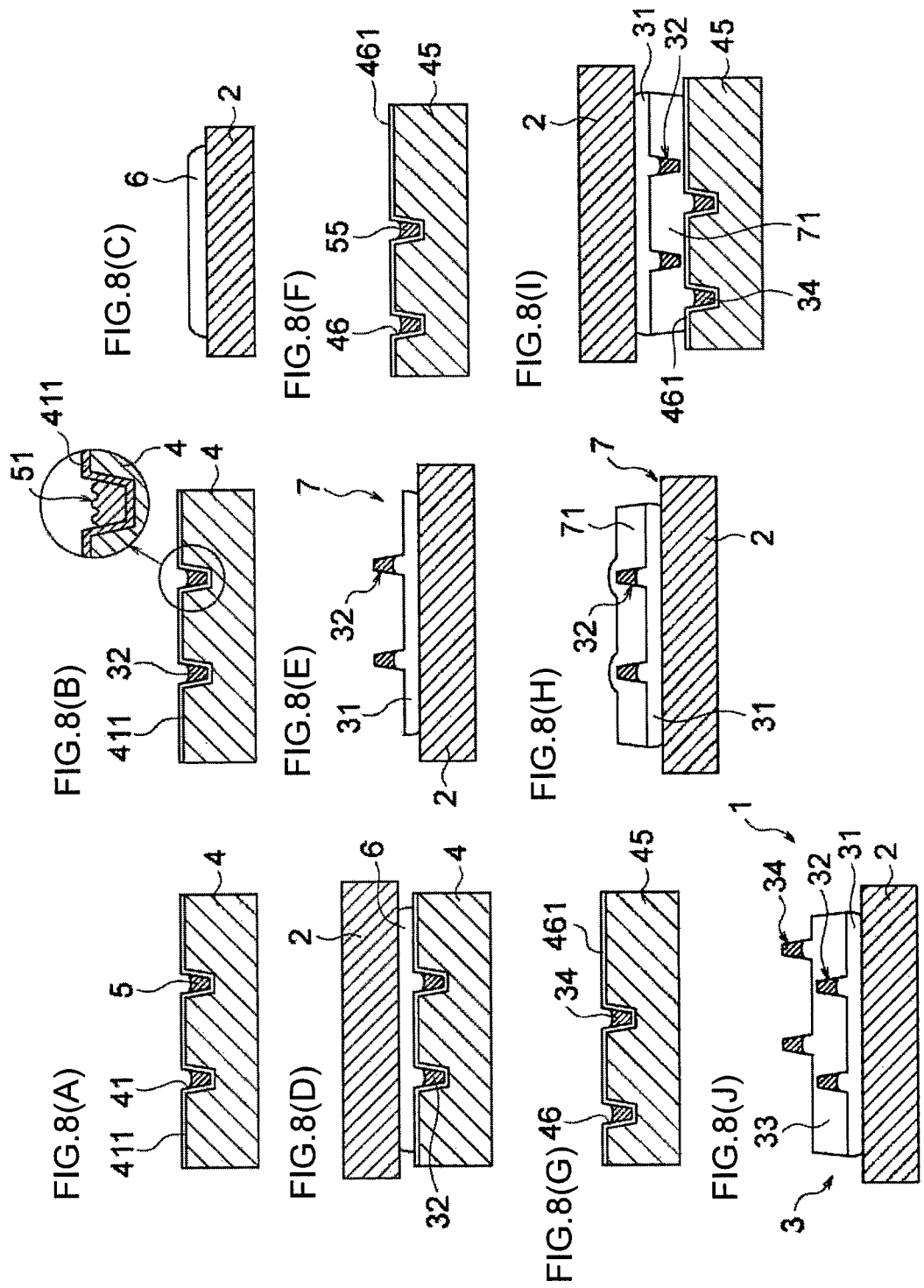
FIG. 8(A) to FIG. 8(J) are sectional views for describing a manufacturing method of a wiring board of the invention.

First, as illustrated in FIG. 8(A), a first intaglio 4 is prepared on which the first electrode pattern 320 of the first conductor layer 32 and a recessed portion 41 having a shape corresponding to the lead-out wire 324 are formed. Glasses such as nickel, silicon, and silicon dioxide, ceramics, organic silicas, glassy carbon, a thermoplastic resin, a photocurable resin, and the like can be exemplified as a material configuring the first intaglio 4. In this embodiment, a sectional shape of the recessed portion 41 is a tapered shape which narrows towards a bottom portion.

In order to improve releasability, it is preferable that a release layer 411 formed of a black lead-based material, a silicone-based material, a fluorine-based material, a ceramic-based material, an aluminum-based material, and the like, is formed on a front surface of the recessed portion 41.

The recessed portion 41 of the first intaglio 4 described above is filled with a conductive material 5. The conductive paste as described above is used as such a conductive material 5. Examples of a method of filling the recessed portion 41 of the first intaglio 4 with the conductive material 5 are capable of including an ink jet method, a spray coating method, a screen printing method, a spin coating method, and the like. The conductive material 5 filled in the intaglio 4 includes first linear portions 52 which are formed according to the shape of the recessed portion 41. The first linear portion 52 corresponds to the first electrode pattern 320 (specifically, the first conductor wires 321 and 322) or the lead-out wire 324. The first linear portion 52 of this embodiment corresponds to an example of the first linear portion of the invention. Herein, a portion corresponding to the first electrode pattern 320 (specifically, the first conductor wires 321 and 322) or the lead-out wire 324 will be also referred to as the first linear portion 52 until the manufacturing of the wiring board 1 is completed.

Next, as illustrated in FIG. 8(B), the conductive material 5 which is filled in the recessed portion 41 of the first intaglio 4 is heated, and thus, a conductor pattern configuring the first conductor layer 32 is formed (a first step). Heating conditions of the conductive material 5 can be suitably set according to the composition or the like of the conductive material. By such a heating treatment, the conductive material 5 is subjected to volume contraction. At this time, an outer surface of the conductive material 5 except for an upper surface is formed to have a shape along the recessed portion 41. On the other hand, an upper surface of the conductive pattern is heated in a state of being in contact with an external atmosphere, and thus, an uneven shape 51 is formed on the basis of the shape of the conductive particles contained in the conductive material 5 (refer to the extracted drawing in FIG. 8(B)). Furthermore, a treatment method of the conductive material 5 is not limited to the heating. The conductive material 5 may be irradiated with an energy ray such as an infrared ray, an ultraviolet ray, and laser light. In addition, the conductive material 5 may be dried. It is possible to increase a contact area between the first conductor layer 32 and the adhesive layer 31, and to more rigidly fix the first conductor layer 32 to the adhesive layer 31, due to the existence of the uneven shape 51.

Subsequently, as illustrated in FIG. 8(C), an adhesive material 6 for forming the adhesive layer 31 is approximately evenly applied onto the substrate 2. The material configuring the adhesive layer 31 described above is used as such an adhesive material 6. A screen printing method, a spray coating method, a bar coating method, a dip method, an ink jet method, and the like can be exemplified as a method of applying the adhesive material 6 onto the substrate 2.

Next, as illustrated in FIG. 8(D), the substrate 2 and the adhesive material 6 are arranged on the first intaglio 4 such that the adhesive material 6 inserted to the recessed portion 41 of the first intaglio 4, the substrate 2 is pressed against the first intaglio 4, and the adhesive material 6 is hardened (a second step). Accordingly, the adhesive layer 31 is formed, and the substrate 2 and the first conductor layer 32 adhere and are fixed to each other through the adhesive layer 31.

Subsequently, as illustrated in FIG. 8(E), the substrate 2, the adhesive layer 31, and the first conductor layer 32 are released from the first intaglio 4, and thus, an intermediate 7 is obtained (a third step).

Subsequently, as illustrated in FIG. 8(F), a second intaglio 45 is prepared on which the second electrode pattern 340 of the second conductor layer 34 and a recessed portion 46 having a shape corresponding to the shape of the lead-out wire 344 are formed. Examples of a material configuring the second intaglio 45 are capable of including the same material as that of the first intaglio 4 described above. In this embodiment, a sectional shape of the recessed portion 46 is a tapered shape which narrows towards a bottom portion. Furthermore, it is preferable that a release layer 461, which is identical to the release layer 411 of the recessed portion 41, is formed on a front surface of the recessed portion 46.

The recessed portion 46 of the second intaglio 45 described above is filled with a conductive material 55. Examples of the conductive material 55 are capable of including the same material as the conductive material 5 described above.

Examples of a method of filling the recessed portion 46 of the second intaglio 45 with the conductive material 55 are capable of including an ink jet method, a spray coating method, a screen printing method, a spin coating method, and the like. The conductive material 55 filled in the intaglio 45 includes second linear portions 56 which are formed according to the shape of the recessed portion 46. The second linear portion 56 corresponds to the second electrode pattern 340 (specifically, the second conductor wires 341 and 342) or the lead-out wire 344. The second linear portion 56 of this embodiment corresponds to an example of the second linear portion of the invention. Herein, a portion corresponding to the second electrode pattern 340 (specifically, the second conductor wires 341 and 342) or the lead-out wire 344 will be also referred to as the second linear portion 56 until the manufacturing of the wiring board 1 is completed.

Next, as illustrated in FIG. 8(G), the conductive material 55 filled in the recessed portion 46 of the second intaglio 45 is heated, and thus, a conductor pattern configuring the second conductor layer 34 is formed (a fourth step). Heating conditions of the conductive material 55 can be suitably set according to the composition or the like of the conductive material. By such a heating treatment, the conductive material 55 is subjected to volume contraction, and an outer surface of the conductive material 55 except for an upper surface is formed to have a shape along the recessed portion 46. On the other hand, the same uneven shape as the concave-convex shape 51 is formed on an upper surface of the conductor pattern. Furthermore, a treatment method of the conductive material 55 is not limited to the heating. The conductive material 55 may be irradiated with an energy ray such as an infrared ray, an ultraviolet ray, and laser light. In addition, the conductive material 55 may be dried. The same concave-convex shape as the concave-convex shape 51 is formed in the conductor pattern, and thus, it is possible to increase a contact area between the second conductor layer 34 and the resin layer 33, and to more rigidly fix the second conductor layer 34 to the resin layer 33.

Subsequently, as illustrated in FIG. 8(H), a resin material 71 configuring the resin layer 33 is applied onto the intermediate 7 (a fifth step). The material configuring the resin layer 33 described above is used as such a resin material 71. Furthermore, it is preferable that the viscosity of the material configuring the resin layer 33 is 1 mPa·s to 10,000 mPa·s, from the viewpoint of ensuring sufficient fluidity at the time of performing coating. In addition, a storage elastic modulus of the resin after being hardened is preferably less than or equal to $10^5$ Pa, and is more preferably less than or equal to $10^4$ Pa, from the viewpoint of the durability of the first conductor layer 32 or the second conductor layer 34. A screen printing method, a spray coating method, a bar coating method, a dip method, an ink jet method, and the like can be exemplified as a method of applying the resin material 71 onto the intermediate 7.

Next, as illustrated in FIG. 8(I), the intermediate 7 and the resin material 71 are arranged on the second intaglio 45 such that the resin material 71 is inserted to the recessed portion 46 of the second intaglio 45, the intermediate 7 is pressed against the second intaglio 45, and the resin material 71 is hardened (a sixth step). A pressurizing force at the time of pressing the intermediate 7 against the second intaglio 45 is preferably 0.001 MPa to 100 MPa, and is more preferably 0.01 MPa to 10 MPa. Furthermore, the pressurization can be performed by using a pressurizing roller or the like. Accordingly, the resin layer 33 is formed, and the intermediate 7 and the second conductor layer 34 adhere and are fixed to each other through the resin layer 33.

Figure 9:
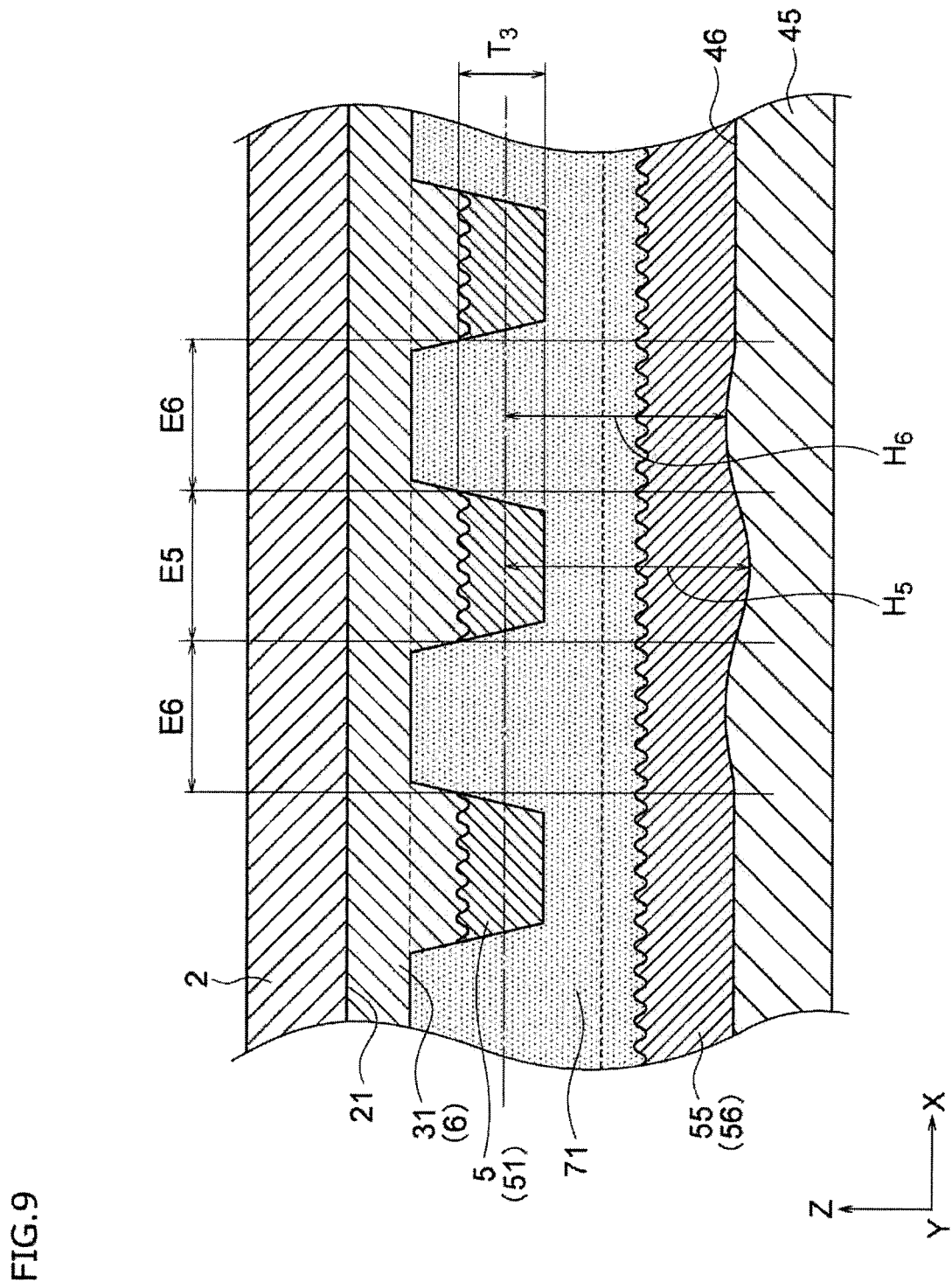
FIG. 9 is a sectional view for describing the manufacturing method of a wiring board of the invention, and is diagram illustrating a state in which an intermediate is pressed against a second intaglio plate.

In this embodiment, as illustrated in FIG. 9, in a state where the intermediate 7 and the resin material 71 are pressed against the second intaglio 45, a relationship in a maximum height ($H_5$) of the second linear portion 56, a minimum height ($H_6$) of the second linear portion 56, and a thickness ($T_3$) of the first linear portion 52 satisfies Formula (6) described below.

$$|H_5-H_6|<T_3/3 \qquad (6)$$

Here, in Formula (6) described above, $H_5$ is the maximum height of the second linear portion 56 in a fifth region E5 corresponding to the first linear portion 52 (a height from an average surface S of the first linear portion 52) in a third predetermined sectional surface crossing the wiring body 3 along the second linear portion 56 (a sectional surface corresponding to FIG. 9), $H_6$ is the minimum height of the second linear portion 56 in a sixth region E6 which is adjacent to the fifth region E5 and has the same width as that of the fifth region E5 (a height from the average surface S of the first linear portion 52) in the third predetermined sectional surface, and $T_3$ is an average thickness of the first linear portion 52 in the third predetermined sectional surface.

Then, as illustrated in FIG. 8(J), the intermediate 7, the resin layer 33, and the second conductor layer 34 are released from the second intaglio (a seventh step), and thus, it is possible to obtain the wiring board 1 including the wiring body 3 of this embodiment.

Furthermore, the sequence of the first step to the seventh step described above is not particularly limited to the above description. For example, the fourth step and the fifth step may be switched from each other, or may be performed in parallel.

Next, the function of the wiring board 1 including the wiring body 3 of this embodiment and the method for producing thereof will be described.

In the method for producing the wiring board 1 of this embodiment, first, the intermediate 7 is prepared in which the first conductor layer 32 is disposed on the substrate 2 through the adhesive layer 31 (refer to FIG. 8(E)). Next, the second conductor layer 34 is formed on the intermediate 7. That is, the first conductor layer 32 and the second conductor layer 34 are formed on one main surface 21 of one substrate 2. For this reason, it is possible to thin the wiring board 1, compared to a wiring board which is configured by bonding substrates respectively having only one conductor layer formed on one surface to each other.

In addition, in the wiring board which is configured by bonding substrates respectively having only one conductor layer formed on one surface to each other, it is necessary to bond the substrates to each other with a high positional accuracy. At this time, in a case where a conductive material is provided on the substrate, and then, the conductive material is heated, and thus, the conductor layer is formed, a change in the shape of the substrate occurs due to the heating, and there is a case where it is difficult to position two substrates with a high accuracy.

In contrast, in the wiring board 1 of this embodiment, the conductive material 5 is filled in the recessed portion 41 of the first intaglio 4 and is heated, and then, the conductive material 5 is transferred onto the substrate 2, and thus, the first conductor layer 32 is formed (refer to FIG. 8(A) to FIG. 8(E)). In addition, the conductive material 55 is filled in the recessed portion 46 of the second intaglio 45 and is heated, and then, the conductive material 55 is transferred onto the intermediate 7, and thus, the second conductor layer 34 is formed. Accordingly, it is possible to form the first conductor layer 32 and the second conductor layer 34 without a change in the shape of the substrate 2 due to the heating of the conductive materials 5 and 55, and thus, the first conductor layer 32 and the second conductor layer 34 are easily positioned with a high accuracy.

Further, in the method for producing of this embodiment, the intermediate 7 and the resin material 71 are arranged on the second intaglio 45, the intermediate 7 is pressed against the second intaglio 45, and the resin material 71 is hardened (refer to FIG. 8(I)). Accordingly, in the wiring board 1, the front surface of the resin layer 33 which is exposed from the second conductor layer 34 becomes smooth, and satisfies Formula (5) described above, and thus, it is possible to suppress the disconnection of the first conductor wire 322 or the like due to the concentration of the stress on the first conductor layer 32, and to improve the durability of the wiring board 1.

In addition, the first conductor wire 322 of this embodiment has a tapered shape which narrows towards the second conductor layer 34 side. Accordingly, it is possible to improve the mechanical strength of the first conductor wire 322 with respect to a pressing force at the time of pressing the intermediate 7 against the second intaglio 45, compared to a case where the first conductor wire 322 does not have the tapered shape or a case where the first conductor wire 322 has a reversely tapered shape. For this reason, it is possible to suppress the disconnection of the first conductor wire 322 at the time of being manufactured, and to further improve the durability of the wiring board 1. In this embodiment, the second conductor wire 342 also has the same tapered shape (a tapered shape which narrows towards a side separated from the first conductor layer 32). Accordingly, it is possible to suppress the disconnection of the second conductor wire 342 by also improving the mechanical strength thereof, and thus, it is possible to further improve the durability of the wiring board 1.

In addition, the wiring board 1 manufactured by the method for producing of this embodiment is formed such that the second conductor layer 34 is approximately parallel to the main surface 21 of the substrate 2, and satisfies Formula (4) described above. Accordingly, it is possible to prevent an excessive stress due to a thermal shock or an external force from being concentrated on the second conductor wire 342, and thus, it is possible to further improve the durability of the wiring board 1.

In addition, in the wiring body 3 of this embodiment, a relative relationship of the surface roughness (that is, a roughness parameter blocking a waviness component) between the lower surface 326 of the first conductor wire 322 and surfaces except for the lower surface 326 (a surface including the upper surface 325 and the side portion 323), in the sectional surface of the first conductor wire 322 in the width direction, is also noticed, and the surface roughness Ra of the lower surface 326 is relatively rougher than the surface roughness Ra of the other surface. For this reason, it is possible to suppress the diffuse reflection of the light which is incident from the outside while allowing the adhesive layer 31 to rigidly adhere to the first conductor wire 322. In particular, in a case where the width of the first conductor wire 322 is within a range of 1 μm to 5 μm, a relative relationship of the surface roughness between the lower surface 326 and the other surface satisfies the relationship described above, and thus, it is possible to remarkably exhibit an effect of enabling the diffuse reflection of the light which is incident from the outside to be suppressed while allowing the adhesive layer 31 to rigidly adhere to the first conductor wire 322.

In addition, in this embodiment, the side portion 323 extends to be substantially coincident with the virtual straight line passing through the first portion 3231 and the second portion 3232. In this case, the sectional surface of the first conductor wire 322 in a transverse direction, a side surface does not have a shape which is recessed to the inside from the virtual straight line passing through the first portion 3231 and the second portion 3232 (a shape in which the bottom of the conductive pattern widens), and thus, the diffuse reflection of the light which is incident from the outside on the wiring body 3 is suppressed. Accordingly, it is possible to further improve the visibility of the wiring body 3.

In addition, in this embodiment, the surface roughness Ra of the lower surface 326 is relatively rougher than the surface roughness Ra of surfaces except for the lower surface 326 (the surfaces including the upper surface 325 and the side portion 323), and thus, the diffuse reflectance of the wiring body 3 on the other surface side is relatively smaller than the diffuse reflectance of the wiring body 3 on the lower surface 326 side. Here, in a case where the diffuse reflectance of the wiring body 3 decreases, it is possible to prevent the first conductor wire 322 from being reflected to be white, and to suppress a contrast decrease in a region where the first conductor wire 322 can be viewed. Thus, it is possible to further improve the visibility of the wiring body 3 of this embodiment.

Furthermore, the fundamental configuration of the first conductor wire 321 or the second conductor wires 341 and 342 of the second conductor layer 34 is identical to that of the first conductor wire 322. The wiring body 3 includes the first conductor wire 321 or the second conductor wires 341 and 342, and thus, is capable of obtaining the same function and the same effect as the function and the effect described above.

Furthermore, the embodiments described above have been described for easily understanding the invention, and are not described for limiting the invention. Therefore, each constituent disclosed in the embodiments described above includes all design changes or equivalents belonging to the technical scope of the invention.

For example, in the embodiments described above, a metal material or a carbon-based material is used as the conductive particles configuring the first conductor layer and the second conductor layer, but the conductive particles are not particularly limited thereto, and a mixture of the metal material and the carbon-based material may be used as the conductive particles. In this case, in the case of describing the first conductor wire 322 as an example, the carbon-based material may be disposed on the first conductor wire 322 on the upper surface 325 side, and the metal material may be disposed on the first conductor wire 322 on the lower surface 326 side. In addition, on the contrary, the metal-based material may be disposed on the first conductor wire 322 on the upper surface 325 side, and the carbon-based material may be disposed on the first conductor wire 322 on the lower surface 326 side.

In addition, for example, the substrate 2 may be omitted from the wiring board 1 of the embodiments described above. In this case, for example, the wiring body or the wiring board may be configured as a configuration in which a peeling sheet is disposed on the lower surface of the adhesive layer 31, and the peeling sheet is peeled off at the time of mounting the adhesive layer 31, and the adhesive layer 31 adheres to and is mounted on a mounting target (a film, surface glass, a polarizing plate, a display, and the like). Furthermore, in such a configuration, the mounting target corresponds to an example of a base material of the invention. In addition, the wiring body or the wiring board may be configured as a configuration in which a resin portion covering the second conductor layer 34 is disposed, and the second conductor layer 34 adheres to and is mounted on the mounting target described above through the resin portion.

In addition, for example, the conductive material 5 is filled in the first intaglio 4 and is heated, and then, a resin material is applied onto the first intaglio 4, and the resin material is solidified. Then, the wiring body or the wiring board may be configured by using the solidified resin material as the base material. Even in this case, it is possible to exhibit the same effect as that of the embodiments described above.

Figure 10:
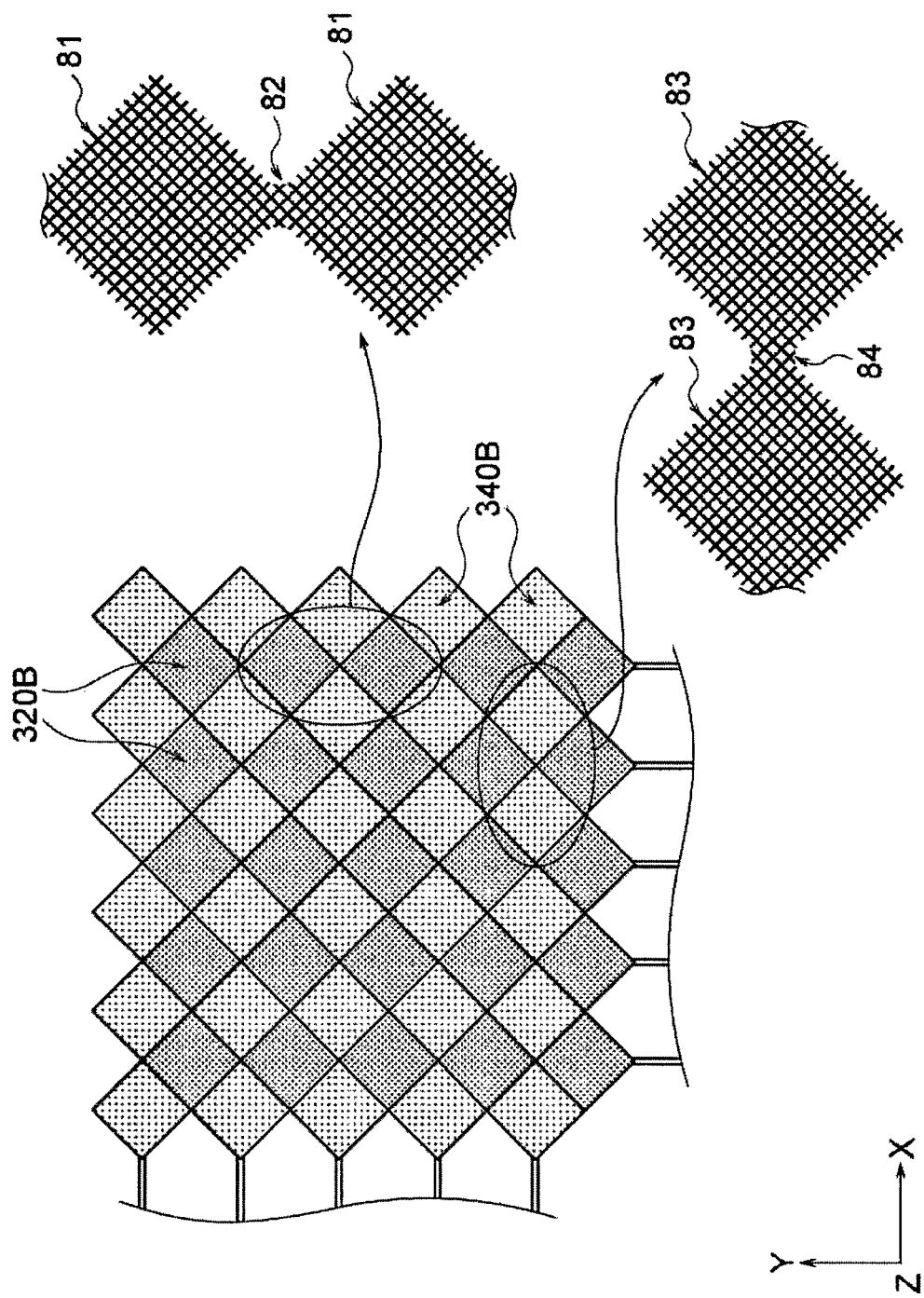
FIG. 10 is a plan view illustrating a modification example of the first conductor layer and the second conductor layer of the embodiment of the invention.

In addition, for example, the first electrode pattern of the first conductor layer 32 and the second electrode pattern of the second conductor layer 34 may have a configuration as illustrated in FIG. 10.

In an example of FIG. 10, a first electrode pattern 320B is configured of rectangular portions 81, and a coupling portion 82 coupling the rectangular portions 81 together. In the rectangular portions 81, diagonal lines are arranged side by side in a Y axis direction approximately at regular intervals along the Y axis direction in FIG. 10, and the coupling portion 82 connects corner portions of the adjacent rectangular portions 81 to each other. The rectangular portion 81 and the coupling portion 82 have a mesh-like shape which is configured of conductor wires.

A second electrode pattern 340B is also configured of rectangular portions 83, and a coupling portion 84 coupling the rectangular portions 83 together. In the rectangular portions 83, diagonal lines are arranged side by side in an X axis direction approximately at regular intervals along the X axis direction in FIG. 10, and the coupling portion 84 connects corner portions of the adjacent rectangular portions 83 to each other. The rectangular portion 83 and the coupling portion 84 also have a mesh-like shape which is configured of conductor wires. The first electrode patterns 320B are arranged approximately at regular intervals along the X axis direction in FIG. 10, and the second electrode patterns 340B are arranged approximately at regular intervals along the Y axis direction in FIG. 10. Then, the first electrode patterns 320B and the second electrode patterns 340B intersect with each other in the coupling portions 82 and 84.

In this example, it is possible to exhibit the same effect as the effect described in the embodiments described above.

In addition, in the embodiments described above, the wiring body has been described as being used in the touch sensor or the like, but the application of the wiring body is not particularly limited thereto. For example, the wiring body is energized and is allowed to produce fever by resistive heating or the like, and thus, the wiring body may be used as a heater. In this case, it is preferable that a carbon-based material having a comparatively high electric resistance value is used as the conductive particles configuring the conductor layer. In addition, a part of a conductive layer of the wiring body is grounded, and thus, the wiring body may be used as an electromagnetic shield. In addition, the wiring body may be used as an antenna. In this case, the mounting target on which the wiring body is mounted corresponds to an example of the support of the invention.

EXPLANATIONS OF LETTERS OR NUMERALS

1: wiring board
2: substrate
21: main surface
3: wiring body
31: adhesive layer (first resin)
311: support portion
312: smooth portion
32: first adhesive layer
320, 320B: first electrode pattern
321, 322: first conductor wire
323: side portion
3231: first portion
3232: second portion
3233: flat portion
324: lead-out wire
325: upper surface (first facing surface)
3251: flat portion
326: lower surface
33: resin layer (second resin)
331: main portion
332: protrusion
34: second conductor layer
340, 340B: second electrode pattern
341, 342: second conductor wire
343: side portion
3431: first portion
3432: second portion
3433: flat portion
344: lead-out wire
345: upper surface
3451: flat portion
346: lower surface (second facing surface)
4: first intaglio
41: recessed portion
411: release layer 45: second intaglio
46: recessed portion
461: release layer
5: conductive material
51: concave-convex shape
52: first linear portion
55: conductive material
56: second linear portion
6: adhesive material
7: intermediate
71: resin material

The invention claimed is:

1. A wiring body, comprising:
a first conductor layer including a first conductor wire;
a resin layer covering the first conductor layer; and
a second conductor layer disposed on the first conductor layer through the resin layer and including a second conductor wire, wherein
the following Formula (1) is satisfied:

$$|H_1 - H_2| < T_1/3 \qquad (1)$$

in the Formula (1), $H_1$ is a maximum height of the second conductor wire in a first region corresponding to the first conductor wire in a first predetermined sectional surface crossing the wiring body along the second conductor wire, $H_2$ is a minimum height of the second conductor wire in a second region which is adjacent to the first region and has the same width as that of the first region in the first predetermined sectional surface, and $T_1$ is a thickness of the first conductor wire in the first predetermined sectional surface.

2. The wiring body according to claim 1, wherein the following Formula (2) is further satisfied:

$$|H_3 - H_4| < T_2/3 \qquad (2)$$

in the Formula (2), $H_3$ is a maximum height of the resin layer in a third region corresponding to the first conductor wire in a second predetermined sectional surface of the wiring body crossing the resin layer which is exposed from the second conductor layer, $H_4$ is a minimum height of the resin layer in a fourth region which is adjacent to the third region and has the same width as that of the third region in the second predetermined sectional surface, and $T_2$ is a thickness of the first conductor wire in the second predetermined sectional surface.

3. The wiring body according to claim 1, wherein a distance between the first conductor layer and the second conductor layer is 1 time to 20 times the thickness of the first conductor layer.

4. The wiring body according to claim 1, wherein the first conductor wire has a tapered shape which narrows towards the second conductor layer side.

5. The wiring body according to claim 1, wherein the second conductor wire has a tapered shape which narrows towards a side separated from the first conductor layer.

6. The wiring body according to claim 1, wherein a surface roughness of a surface on a side opposite to a first facing surface facing the second conductor wire is rougher than a surface roughness of the first facing surface in the first conductor wire.

7. The wiring body according to claim 1, wherein a surface roughness of a second facing surface facing the first conductor wire is rougher than a surface roughness of a surface on a side opposite to the second facing surface in the second conductor wire.

8. The wiring body according to claim 1, wherein the resin layer includes a protrusion protruding towards the second conductor layer, and the second conductor wire is disposed on the protrusion.

9. A wiring board comprising:
the wiring body according to claim 1; and
a support that supports the wiring body.

10. A touch sensor, comprising:
the wiring board according to claim 9.

11. A method for producing a wiring body comprising:
a first process of filling a recessed portion of a first intaglio with a first conductive material, and of performing heating, drying, or irradiating with an energy ray with respect to the first conductive material;
a second process of disposing a first resin on the first conductive material;
a third process of preparing an intermediate obtained by releasing the first resin and the first conductive material from the first intaglio;
a fourth process of filling a recessed portion of a second intaglio with a second conductive material, and of performing heating, drying, or irradiating with an energy ray with respect to the second conductive material;
a fifth process of coating a surface of the intermediate on which the first resin is disposed with a second resin;
a sixth process of disposing the second resin and the intermediate on the second conductive material such that the second resin is in contact with the second conductive material; and
a seventh process of releasing the intermediate, the second resin, and the second conductive material from the second intaglio, wherein
the first conductive material includes a first linear portion,
the second conductive material includes a second linear portion, and
a relationship in a maximum height of the second linear portion, a minimum height of the second linear portion, and a thickness of the first linear portion satisfies the following Formula (3):

$$|H_5 - H_6| < T_3/3 \qquad (3)$$

in the Formula (3), $H_5$ is a maximum height of the second linear portion in a fifth region corresponding to the first linear portion in a third predetermined sectional surface crossing the wiring body along the second linear portion, $H_6$ is a minimum height of the second linear portion in a sixth region which is adjacent to the fifth region and has the same width as that of the fifth region in the third predetermined sectional surface, and $T_3$ is a thickness of the first linear portion in the third predetermined sectional surface.

* * * * *